United States Patent [19]
Suzuki et al.

[11] Patent Number: 5,666,053
[45] Date of Patent: Sep. 9, 1997

[54] CHARGED PARTICLE BEAM APPARATUS FOR MEASURING MAGNETIC FIELD

[75] Inventors: Hiroshi Suzuki, Kokubunji; Hiroyuki Shinada, Chofu; Katsuhiro Kuroda, Hachioji; Yusuke Yajima, Kokubunji; Yoshio Takahashi, Kunitachi; Hideo Saito, Hachioji; Masato Nakajima, Chofu, all of Japan

[73] Assignee: Hitachi, Ltd., Tokyo, Japan

[21] Appl. No.: 391,951

[22] Filed: Feb. 21, 1995

[30] Foreign Application Priority Data

Feb. 23, 1994 [JP] Japan .................................. 6-025065

[51] Int. Cl.$^6$ ............................. G01R 33/00; G21K 1/00; G06G 7/48
[52] U.S. Cl. ............................................ 324/250; 324/261
[58] Field of Search ............................ 324/244, 250, 324/260, 261; 250/310, 311

[56] References Cited

U.S. PATENT DOCUMENTS

| | | |
|---|---|---|
| 5,075,623 | 12/1991 | Matsuda et al. . |
| 5,111,141 | 5/1992 | Fukuhara et al. . |
| 5,153,434 | 10/1992 | Yajima et al. ........................... 350/311 |

FOREIGN PATENT DOCUMENTS

4003308 A1  2/1990  Germany .

OTHER PUBLICATIONS

Application of the Hough Transform to Electron Diffraction Patterns, Russ, et al., Journal of Computer-Assisted Microscopy, Mar. 1989, vol. 1, No. 1, 1989, pp. 3–37.

Measurement Technology of Three–Dimensional Magnetic Stray Field, Matsuda, Journal of Electronic Engineering, Jun. 1989, pp. 68–73.

A Three–Dimensional Reconstruction of Stray Magnetic Fields of a Magnetic Head by Electron Beam Tomography, Matsuda, et al., Journal on Magnetics in Japan, Oct. 1991, vol. 6, No. 10, pp. 826–834.

Thornley, "Mapping an AC Magnetic Field", IBM Technical Disclosure Bulletin vol. 12, No. 6 Nov. 1969 pp. 810–811.

Wade, R. H. "The Measurement of Magnetic Microfields," IEEE Transactions on Magnetics, vol. Mag–12, No. 1, Jan. 1976, pp. 34–39. (English).

Elsbrock, J. B., et al. "Evaluation of Three–Dimensional Micromagnetic Stray Fields by Means of Electron–Beam Tomography," IEEE Transactions on Magnetics, vol. Mag–21, No. 5, Sep. 1985, pp. 1593–1595. (English).

Shinada, Hiroyuki, et al. "Dynamic Micromagnetic Field Measurement by Stroboscopic Electron Beam Tomography," IEEE Transactions on Magnetics, vol. 28, No. 2, Mar. 1992, pp. 1017–1023. (English).

*Primary Examiner*—Walter E. Snow
*Attorney, Agent, or Firm*—Fay, Sharpe, Beall, Fagan, Minnich & McKee

[57] ABSTRACT

A charged particle beam is transmitted through a specimen for producing an irregular pattern as a first image. Further, a magnetic field to be measured is arranged in space where a charged particle beam is passed between the specimen and an image plane thereby to produce a second image having an irregular pattern as in the foregoing case. The first image and the second image are processed to produce the deflection angle of the charged particle beam due to the magnetic field. This deflection angle is extracted from the entire positions of a cross section of the space where measurement is desired, thereby constructing projection data of a magnetic field by a charged particle beam. Furthermore, the magnetic field to be measured is rotated and the above-mentioned processing is performed from each direction to construct projection data. The projection data thus obtained and the computer tomography technique are used to determine a magnetic field at each point in space.

38 Claims, 16 Drawing Sheets

FIG. 7
MAGNETIC FIELD INTENSITY ALONG X DIRECTION OF MAGNETIC HEAD IN a PLANE
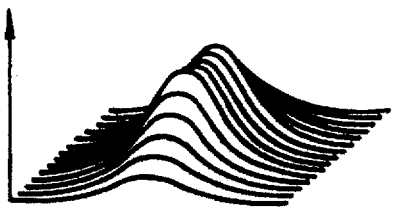
MAGNETIC FIELD INTENSITY ALONG X DIRECTION OF MAGNETIC HEAD IN b PLANE
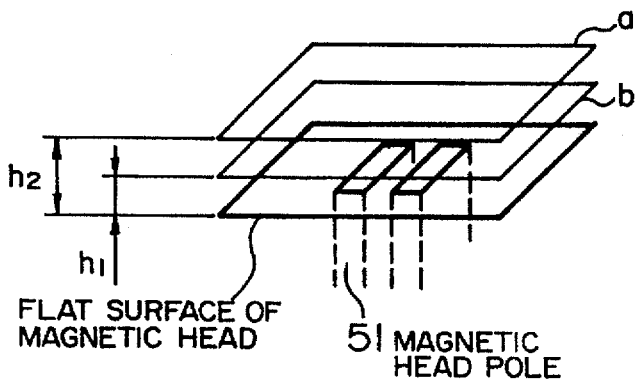 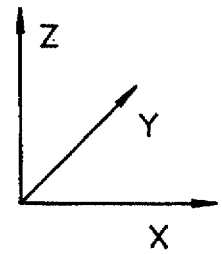
FLAT SURFACE OF MAGNETIC HEAD
51 MAGNETIC HEAD POLE

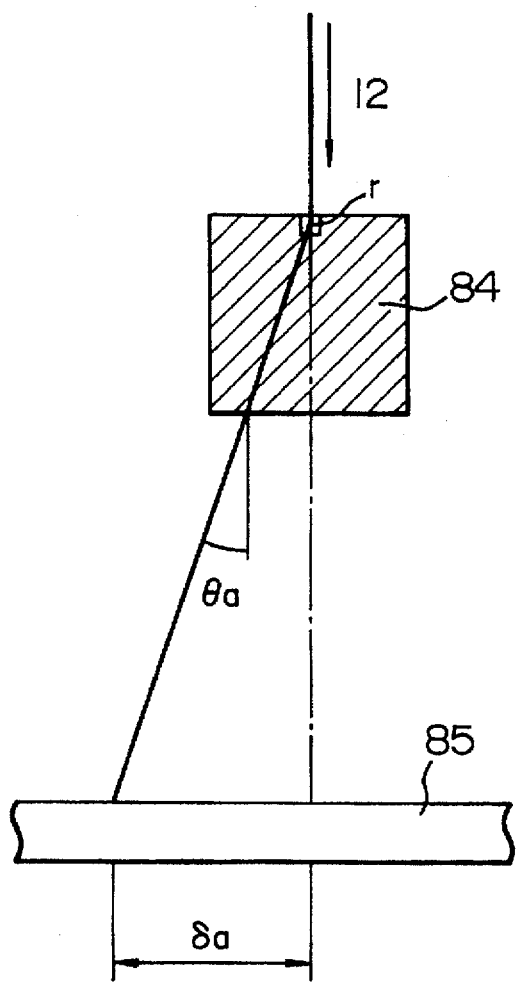
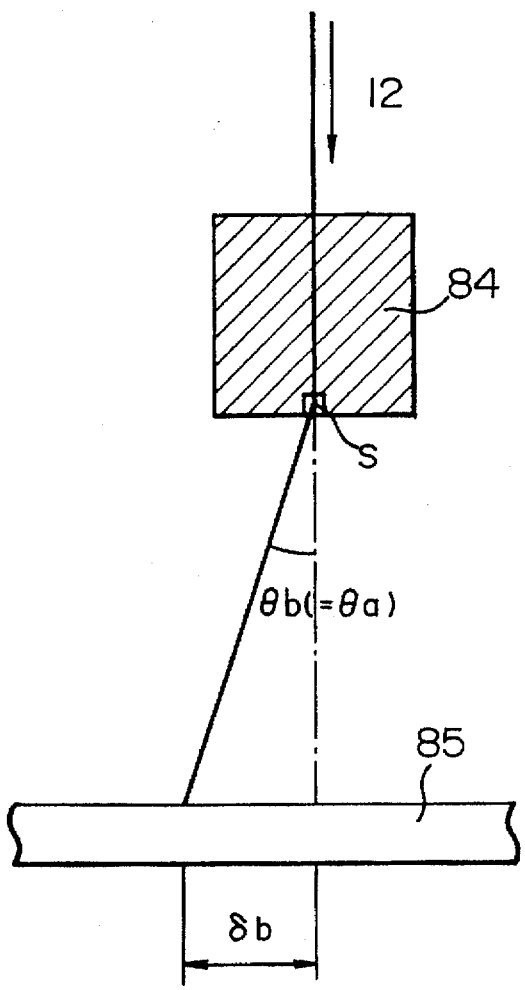

CHARGED PARTICLE BEAM APPARATUS FOR MEASURING MAGNETIC FIELD

BACKGROUND OF THE INVENTION

The present invention relates to an apparatus and a method for measuring the magnetic field with a high spatial resolution using a charged particle beam in vacuum.

The magnetic head for accommodating an increased capacity of magnetic recording has been increasingly reduced in size. A technique has been reported for measuring the magnetic field existing in a small area such as generated by a magnetic head using a charged particle beam.

An example of observing the magnetic field generated by a magnetic head using the transmission electron microscope is described in IEEE Transaction on Magnetics, Vol. MAG-12, No. 1, January 1976, pp. 34–39. The method of measuring the magnetic field described in this reference has been executed by the procedure described below. First, an electron beam is transmitted through an amorphous film or a carbon film deposited with silver, and a photographic plate is exposed to a bright field image of this film. The image thus obtained is used as a reference image. Next, a magnetic head is placed under an object lens in the microscope so that the electron beam transmitted through the film passes through an area including the magnetic field generated by the head. The same photographic plate that is exposed to the reference image is also exposed to the bright field image thus obtained. The second bright field image to which the photographic plate is exposed has the film particles appearing partially distorted as compared with the reference image. This is due to the fact that the electron beam that has passed through the magnetic field of the magnetic head is bent in orbit under the influence of Lorentz force. The photographic plate is exposed to double images, one in the absence and the other in the presence of the magnetic field, which contains information that the electron beam is bent by the magnetic field.

The intensity of the magnetic field are detected by irradiating a laser beam having a finite spot diameter on the double-exposed photographic plate and projecting Young's interference fringes on a screen placed in the rear. The number and direction of the fringes thus projected are assumed to represent the intensity and direction of the magnetic field associated with the position irradiated with the laser beam.

Also, IEEE Transaction on Magnetics, Vol. MAG-21, No.5, September 1985, pp.1593–1595 discloses a method of measuring the magnetic field using an apparatus similar to the scanning electron microscope. This method is described below.

First, a focused electron beam is scanned on a flat plane of a magnetic head specimen generating a magnetic field. The electron beam is subjected to Lorentz force and bent in orbit as it passes through the magnetic field. The displacement of the electron beam is measured to provide projection data of a cross section of the magnetic field. This measurement is effected repeatedly by turning the magnetic head. The projection data of the cross section of the magnetic field was processed by utilizing the computer tomography technique thereby to obtain the direction and magnitude, that is, the magnetic field distribution of the magnetic field at each point of space.

Further, IEEE Transaction on Magnetics, Vol. MAG-28, No.2, March 1992, pp.1017–1023 discloses a method in which the electron beam is made stroboscopic with a apparatus configuration similar to the one described above, which beam is generated in synchronism with the magnetic head operated with a high frequency. The displacement due to the magnetic field of the stroboscopic electron beam is measured by a semiconductor position detector, and a dynamic result of observation of the magnetic field distribution of the magnetic head has been reported.

Three conventional techniques for measuring the magnetic field were described above. These methods have their problems respectively.

First, the technique using the transmission electron microscope first described above has two problems as described below. One is that information on the magnetic field cannot be obtained for each point of space. The magnetic field information obtained is an integral value of the magnetic field existing in the region where the electron beam has passed. This is by reason of the fact that all the information on the magnetic field along the route of the electron beam is concentrated on the movement of particles on the photographic plate.

Another problem is that the wide dynamic range of the magnetic field intensity to be measured cannot be compatible with the high spatial resolution. This is for the reason mentioned below.

The spot diameter of the laser beam irradiated on the photographic plate corresponds to the spatial resolution of measurement, and the smaller the spot diameter, the higher the spatial resolution. For Young's interference fringes to be generated, however, the image of particles moved on the photographic plate by the magnetic field must be contained in the spot of the laser beam. The spot diameter of the laser beam, therefore, must be larger than the area covered by the movement of particles. Attempting to measure the line integral value of a large magnetic field deteriorates the spatial resolution. If the dynamic range required of the magnetic field intensity of the magnetic head is to be obtained, for example, the spatial resolution that can be obtained is only about 10 µm.

Also, the two conventional techniques described above using the scanning electron microscope pose two problems described below.

One problem is that the spatial resolution is limited to 0.1 µm though improved over the prior art. This is due to the fact that the spatial resolution is dependent on the diameter of the electron beam passing through the magnetic field and that the beam diameter cannot be reduced further.

Another problem is that the measurable limit in the area closest to the specimen generating the magnetic field is 0.2 µm, and measurement in the nearer area or position is impossible. For the positions closest to the specimen to be measured by the prior art, a focused electron beam is required to be scanned in proximity to the specimen. An attempt to scan the electron beam in excessive proximity to the area closest to a specimen plane, however, causes the electron beam to contact the specimen, thereby making the measurement impossible. This is because of the limit of the positioning accuracy of the electron beam and the fact that the specimen and the electron beam are relatively displaced from each other by drifts.

SUMMARY OF THE INVENTION

An object of the present invention is to provide a method and an apparatus for measuring the intensity of the magnetic field, that is, the magnetic field distribution at each point of space in the area closest to a specimen plane with high resolution and high magnetic field sensitivity and also in a wide dynamic range with respect to the magnetic field.

The above-mentioned object is achieved by the means described below.

According to one aspect of the invention, there is provided a method and an apparatus for measuring the magnetic field existent in a small area, in which an image (first image) of a reference specimen not affected by the magnetic field to be measured and an image (second image) of the reference specimen distorted under the influence of the magnetic field to be measured are formed by transmitting a charged particle beam through the reference specimen, which images are stored separately from each other. The matching operation or the like image processing operation is performed using the first and second images, thereby extracting the displacement of the charged particle beam due to the magnetic field to be measured in a small area. The magnetic field information at each point of space is determined using the computer tomography technique from the information on various angles with respect to the magnetic field.

According to another aspect of the invention, there is provided a method and an apparatus for measuring the magnetic field in a small area, in which a focused charged particle beam is scanned on a reference specimen to form a scan image (first image) of the reference specimen not affected by the magnetic field to be measured arranged in the route of the charged particle beam and a scan image (second image) of the reference specimen distorted under the influence of the magnetic field to be measured. The pattern matching process is performed in a small area using the first and second images in a manner similar to the foregoing case.

According to still another aspect of the invention, there is provided a method and an apparatus for measuring the magnetic field in a small area, in which a charged particle beam is transmitted through a reference specimen and also through a magnetic field to be measured. The distance between the magnetic field to be measured and the image-forming position of the charged particle beam is changed. A plurality of images of the reference specimen distorted under the influence of the magnetic field to be measured are formed, and each of the images thus formed is detected and stored. These stored images are used for image processing thereby to determine the deflection angle of the charged particle beam and to calculate the spatial magnetic field to be measured on the basis of the deflection angle.

According to a further aspect of the invention, there is provided a method and an apparatus for measuring the magnetic field in a small area, in which a focused charged particle beam is passed through a region of the magnetic field to be measured, and the charged particle beam deflected by the magnetic field to be measured is irradiated on a reference specimen. The surface of the reference specimen is thus scanned, and the secondary electrons generated from the reference specimen or the charged particles reflected from the reference specimen are detected, a scan image of the reference specimen distorted under the influence of the magnetic field to be measured is formed, the distance between the position of the magnetic field to be measured and the cross-over point of the charged particle beam is relatively changed, and a plurality of scan images of the reference specimen distorted under the influence of the magnetic field to be measured are formed. Each of the images thus formed is detected and stored. The images thus stored are used for image processing thereby to determine the deflection angle of the charged particle beam and to calculate the magnetic field to be measured in space on the basis of the deflection angle.

A charged particle beam apparatus to achieve the above-mentioned object is realized by either of the configurations described below.

In the case where a charged particle beam is transmitted through a reference specimen, the charged particle beam apparatus comprises means for generating a charged particle beam, means for focusing the charged particle beam, a reference specimen holder, a stage for carrying a specimen generating the magnetic field to be measured, means for controlling the magnification of the image formed by the transmitted charged particle beam, means for detecting the image, means for storing the image, image processing means and means for determining a magnetic field to be measured in space.

In the case where a scan image of a reference specimen is obtained, on the other hand, the charged particle beam apparatus comprises means for generating a charged particle beam, means for focusing the charged particle beam, a reference specimen holder, means for scanning the charged particle beam, means for generating a scan signal, a stage for carrying the specimen generating a magnetic field to be measured, means for making an image with secondary electrons or reflected charged particles and the scan signal, means for detecting an image, means for storing an image, image processing means, and means for determining the magnetic field to be measured in space.

According to a still further aspect of the invention, there is provided a method and an apparatus for measuring the magnetic field in a small area, in which a charged particle beam is passed through the magnetic field to be measured, and the distance between the magnetic field and a position detector for detecting the displacement of the charged particle beam is changed at least once to measure a plurality of displacements. The displacements thus obtained are used to determine the deflection angle of the charged particle beam due to the magnetic field by calculations according to the method of least square or the like method. The magnetic field to be measured in space is calculated on the basis of the deflection angle thus determined.

According to a yet further aspect of the invention, there is provided a method and an apparatus for measuring the magnetic field in a small area, in which a plurality of charged particle beams are passed through the magnetic field, the magnetic field in a region of a given size is measured at a time, or a charged particle beam having a pattern of brightness contrast in a finite diameter is passed through the magnetic field, the magnetic field in a region of a given size is measured at a time. In the process, a two-dimensional image pickup device such as a CCD camera is used as a detector for detecting the displacement of the charged particle beam and producing a plurality of images by changing the distance between the magnetic field and a position detector at least once. A plurality of displacement data are extracted from these images, and the deflection angle of the charged particle beam due to the magnetic field is determined by calculations such as Hough transform. The deflection angle thus determined is used to determine by calculation the magnetic field to be measured in space.

The distance between the magnetic field and the detector is changed by means of changing the image-forming position of a pattern having a brightness contrast or the focal point with respect to the position of the magnetic field to be measured by adjusting an image-forming lens system. At the same time, a plurality of displacements of the charged particle beam are detected by a charged particle beam position detector which is appropriately fixed.

In order to realize the method of measurement of magnetic field described above, an actual charged particle beam apparatus comprises a mechanism for changing the distance between a specimen to be measured and a detector, whereby the three-dimensional intensity distribution of the magnetic field generated by a magnetic lens is measured to evaluate the lens characteristics. The electric field may be used instead of the magnetic field with equal effect. In this case, the lens characteristics are evaluated from the three-dimensional intensity distribution of the electric field of the electrostatic lens.

First, explanation will be made about the principle in which the image of a reference specimen obtained by using a charged particle beam is distorted by the magnetic field existing in the course of progress of the charged particle beam. The charged particles are assumed to have a charge e, a mass m, an electrostatic field intensity E, a magnetic flux density B and a velocity v. Newton equation of motion $m(dv/dt)=eE+e[v \cdot B]$ holds. Suppose that the electrostatic field intensity E is 0 and only a magnetic field exists. Newton equation of motion is obtained as $m(dv/dt)=e[v \cdot B]$ FIG. 2 shows the principle in which a single charged particle beam 41 is deflected by the magnetic field. Assume a magnetic field 42 having a uniform component in a single direction which is assumed to be Y. Also assume that the direction z of progress of the charged particle beam 41 is perpendicular to the direction y. Further, the direction perpendicular to z and y is assumed to be x. In the case where the uniform magnetic field 42 exists by the length of l along direction z, the charged particle beam 41 is subjected to the Lorentz force Fx as it passes through the length l thereby to cause an angular change of the direction of progress. Lorentz force is expressed as $Fx=m(dv_x/dt)=e[v_z \cdot B]$, and the angular change $d\theta$ approximately as $d\theta \approx eBl/mv_z$. This angular change occurs in the x-z plane. As a result of this angular change, the position where the charged particle beam 41 reaches on a screen 43 the distance L away from the position of the magnetic field 42 is displaced by $dx=d\theta L$ as compared with when the magnetic field is absent.

FIG. 3 is a diagram for explaining the way in which parallel charged particle beams 41 generated with equal intervals from each other pass through a magnetic field 42 having an uneven intensity. The charged particle beams 41, as compared when the magnetic field is absent, changes in the point of arrival thereof on the screen 43, so that the intervals between the charged particle beams 41 which had been equidistant before passing through the magnetic field 42 are now uneven. In other words, the intervals are distorted.

In the case where an image of a reference specimen is used, charged particle beams having different brightnesses are passed through the magnetic field substantially in parallel to each other in a plane. Consider individual charged particle beams having different brightnesses in the same plane. The principle in which the image is distorted can be explained in the same manner as described above. More specifically, the points of arrival of the charged particle beams generated from individual positions in a plane of the specimen are displaced variously by the uneven magnetic field existing in the route of the charged particle beams. As a result, the whole image of the reference specimen is observed as a distorted one. This is the principle in which the image of a reference specimen obtained using charged particle beams is distorted by the magnetic field existing in the course of progress of the charged particle beams.

Determining a magnetic field from a distorted image of a reference specimen is the reverse process. More specifically, as far as the displacement dx of the point of arrival of a charged particle beam can be detected from the distorted image of a reference specimen, the deflection angle $d\theta$ of the charged particle beam can also be determined. Further, the linear integral value Bl of the magnetic field can be determined from $d\theta$. The high-resolution image information for an area closest to the specimen obtained by the charged particle beam is handled by computer image processing using the pattern matching. In this process, the spatial resolution corresponds to the size of a third image (template image) providing a reference image. Also, the dynamic range of intensity of the magnetic field to be measured corresponds to the size of an area in the first image (original image) where a template image is examined by pattern matching. These two sizes can be handled independently of each other and therefore the spatial resolution can be separated from the dynamic range. Consequently, measurement of the magnetic field distribution can be realized with a high spatial resolution and a wide dynamic range.

The following is a description of a method of image processing for detecting the displacement dx, i.e., the amount of deflection of the point of arrival of the charged particle beam by comparing the first image (original image) and the second image (reference distorted image).

First, charged particle beams are transmitted through a reference specimen to produce a contrast image of the specimen. The reference specimen is selected in such a manner that the image contains a plurality of brightness contrasts irregularly in a plane as caused by particles. The image contains information on the linear integral value of the magnetic field at each height from a specimen plane generating the magnetic field. A small area is extracted from this information to recognize the pattern of an image in the area and the coordinate of the particular point, for example, the coordinate (xs, ys) at an upper left point. The size of the extracted image corresponds to spatial resolution, and therefore the size of the extracted area is be smaller, the better result is obtained. This area, however, is required to be secured in a size containing some particles as elements allowing extraction of features.

Next, a specimen generating a magnetic field is arranged between a reference specimen and an image plane, so that the charged particle beams of a finite diameter progressing in substantially parallel direction pass the magnetic field and an area containing the specimen generating the magnetic field.

The charged particle beams passing through the magnetic field, which are deflected under the influence of Lorentz force, are observed as a film image produced earlier which is partially distorted. This image distorted by the magnetic field is picked up, and a position having a pattern most resembling the pattern of the extracted image recognized earlier is sought out by pattern matching. The coordinate (xp, yp) of the particular point is recognized. The difference between the point recognized earlier and the point recognized this time provides a change in the point of arrival of the charged particle beams, i.e, the displacement dx.

The pattern matching may be effected by a method in which the number of pixels agreeing or disagreeing in the areas compared is counted, a method in which the difference of brightness between pixels is determined, or a method in which the cross-correlation coefficient is computed. As another alternative, Fourier transform may be utilized with the images overlapped in the case of a weak magnetic field.

Further, the deflection angle $d\theta$ is obtained as described above from the displacement dx, and the linear integral value Bl for the magnetic field is determined from the deflection angle $d\theta$.

In the case where the first image, i.e., the original image not distorted for lack of the magnetic field is not used, the deflection angle $d\theta$ is determined in the manner described below.

In the case where a single charged particle beam is involved, the charged particle beam deflected by the magnetic field to be measured is detected by a two-dimensional plane position detector installed at a lower point. This detector is moved in parallel to the direction of progress of the charged particle beam, and the distance from the magnetic field is changed to measure the displacement dx. Accordingly, assuming the detection plane of the detector is a cross section in space, the deflection points of the charged particle beams for two cross sections are determined. Since the charged particle beam progresses linearly in an area having a detector, a straight line is determined which passes through two assumed spatial points of deflection measured. The angle that the straight line thus obtained forms with the direction of progress of the charged particle beam before deflection provides the deflection angle dθ of the charged particle beam. In the case where the number of measurements of the deflection point is increased for an increased number of spatial cross sections, the number of points in space also increases. A straight line is determined using the approximation by the least square as a deflection angle dθ.

Also, in the case where a plurality of charged particle beams are passed through the magnetic field at a time or a charged particle beam with a finite diameter having a pattern of brightness contrast in a plane is passed through the magnetic field, a two-dimensional image is produced using an image pickup device. In this case, too, as in the above-mentioned case, the image pickup device is moved in the direction parallel to the progress of the charged particle beams to produce a plurality of images. Considering a plurality of bright or dark points observed in a single image, a plurality of straight lines configured in space by these points are determined by using Hough transform. The angle that each of the straight lines thus determined forms with the direction of progress of the charged particle beams before deflection provides the deflection angle dθ with each straight line. In this way, the deflection angle dθ of the charged particle beam due to the magnetic field in an area of a given size can be measured at a time thereby to determine the linear integral value Bl of the magnetic field.

In order to determine the intensity of the magnetic field at each point of a cross section in space, the deflection angle dθ of the charged particle beam due to the magnetic field obtained from the above-mentioned procedure is assumed as projection data, or the linear integral value Bl of the magnetic field obtained from above-mentioned procedure is assumed as projection data, and the distribution of the magnetic field cross section is reconfigured by the computer tomography technique. For this purpose, the deflection angle dθ due to the magnetic field of the charged particles is detected at a number n of points along the direction of the cross section of the magnetic field to be measured thereby to accumulate data of the deflection angle dθ. The direction of the cross section is assumed to be x, for example. Further, the image of a reference film distorted by the magnetic field is picked up from each direction of the magnetic field, and the deflection angle of the charged particle beam is determined by the image processing, with the resulting figure being used as the projection data for the magnetic field. These images are picked in such a manner that the magnetic field to be measured is rotated up to 180 degree in units of several degrees, for example, about the vertical axis of the cross section of the magnetic field to be measured. The data on the deflection angle are obtained from various angles with respect to the cross section of the magnetic field from these images in the same manner as described above. The angular direction with respect to the magnetic field as of the timing of image pickup is assumed to be $\psi m$, and the data on the deflection angle is expressed as $d\theta(x_n, \psi_m)$. With these data as projection data for the magnetic field, the computer tomography operation is performed to calculate the distribution of the cross section of the magnetic field. When the template area for extracting the data on the deflection angle is small, the magnetic field distribution of high spatial resolution can be measured. When a small deflection angle can be detected, the magnetic field sensitivity can be improved. Also, if the detection of a large deflection angle is possible, a large dynamic range of the magnetic field intensity to be measured can be secured.

For the measurement of the magnetic field distribution to be realized for the area closest to a specimen plane, an image closest to the shadow of a specimen generating the magnetic field is used. This position contains the magnetic field information for an area closest to the specimen plane generating the magnetic field. The image of an area closest to a specimen plane is extracted to determine the magnetic field closest to the specimen generating a magnetic field.

Also, a similar measurement of intensity distribution is possible by deflecting the charged particle beam by the electric field E in place of by the magnetic field B.

In this way, the lens characteristics of an electrostatic lens or a magnetic lens can be evaluated by measuring the three-dimensional intensity distribution of the electric field or the magnetic field of the electrostatic lens or the magnetic lens, as the case may be, by this apparatus.

BRIEF DESCRIPTION OF THE DRAWINGS

FIG. 7 is a diagram showing an example of magnetic field distribution measured according to the present invention.

FIGS. 13A and 13B are diagrams for explaining the displacement and the deflection angle.

DESCRIPTION OF THE PREFERRED EMBODIMENTS (First embodiment)

Figure 1:
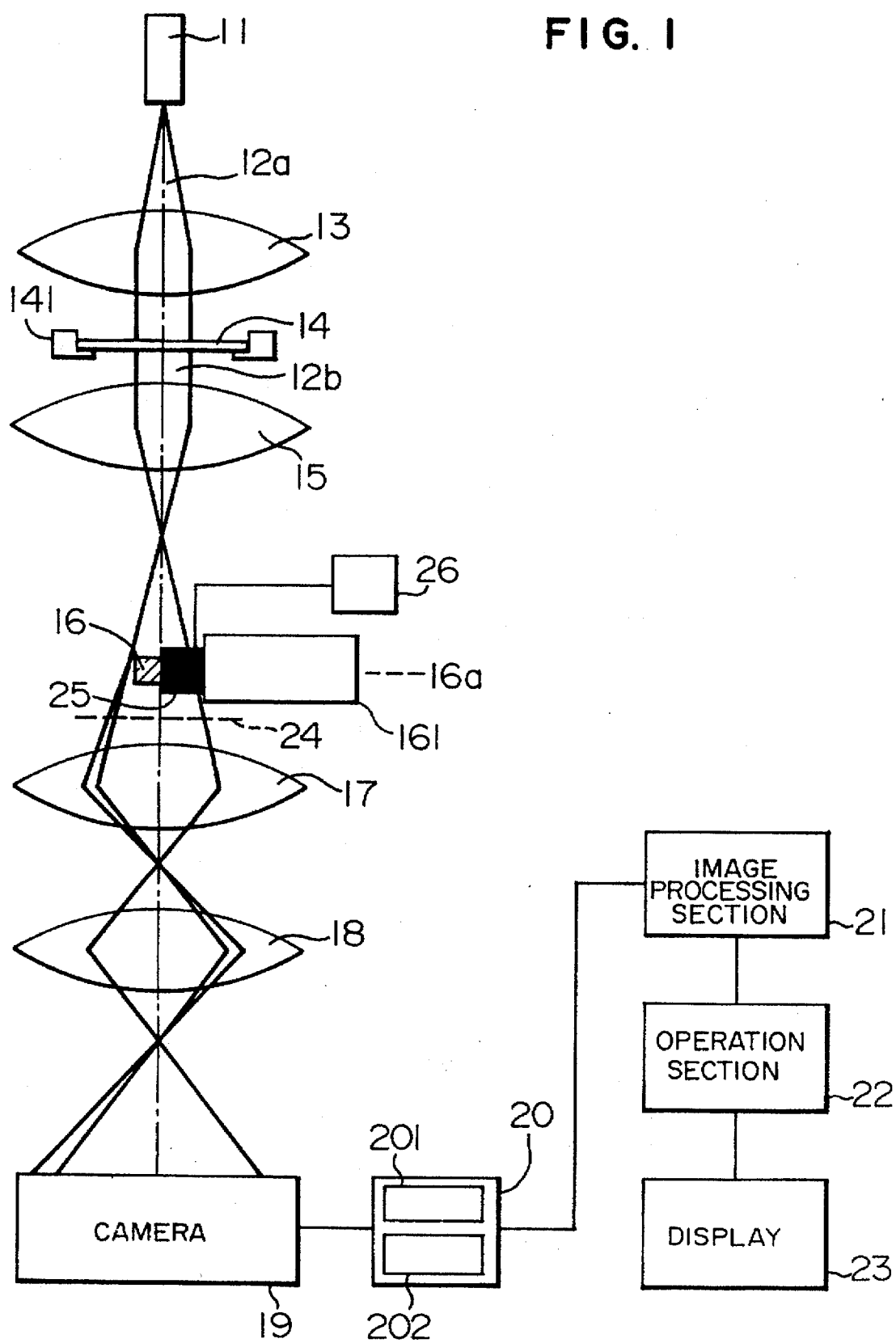
FIG. 1 is a diagram showing a first embodiment of the invention.
Figure 2:
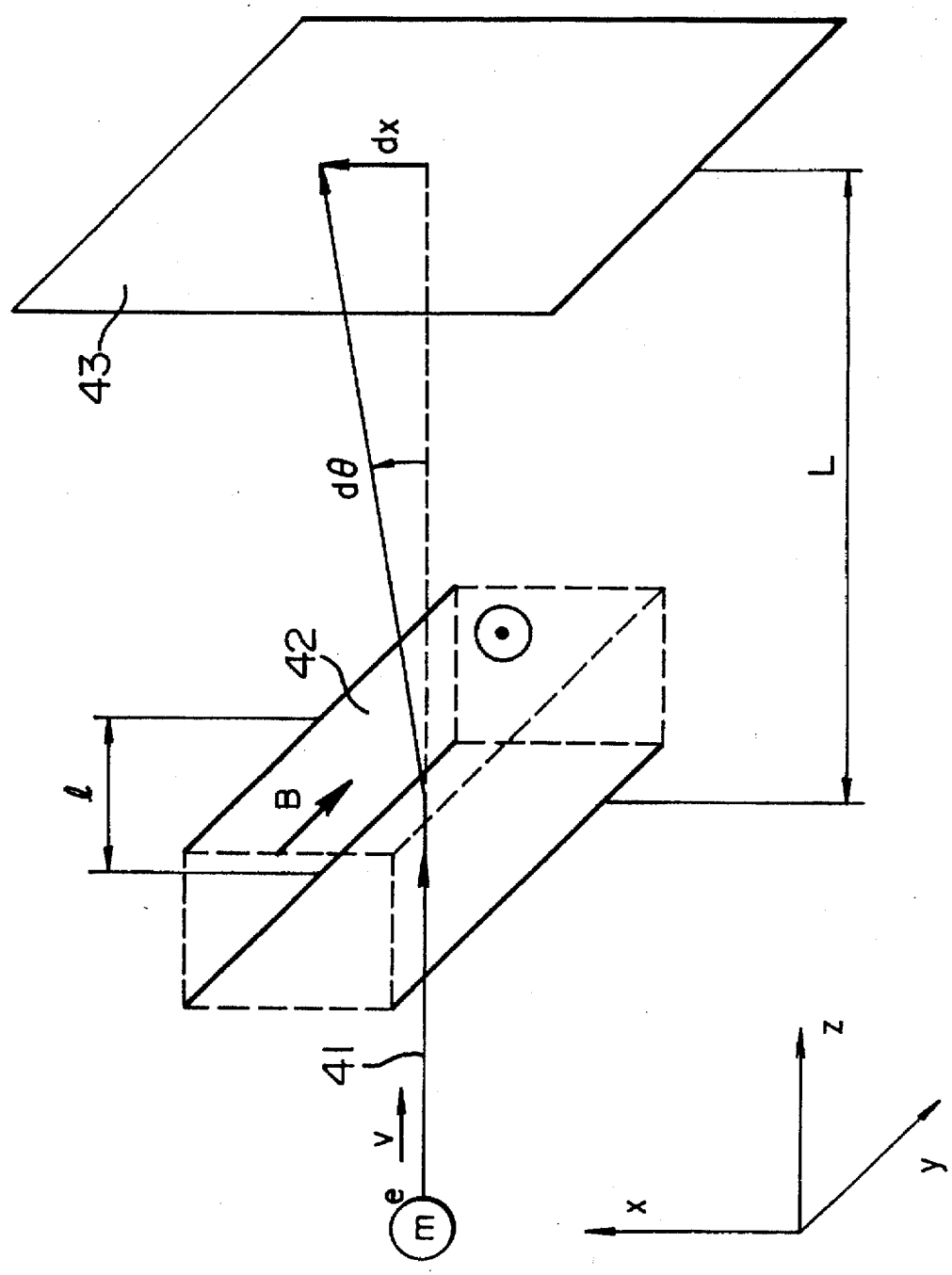
FIG. 2 is a diagram for explaining the deflection of a charged particle beam due to a magnetic field.
Figure 3:
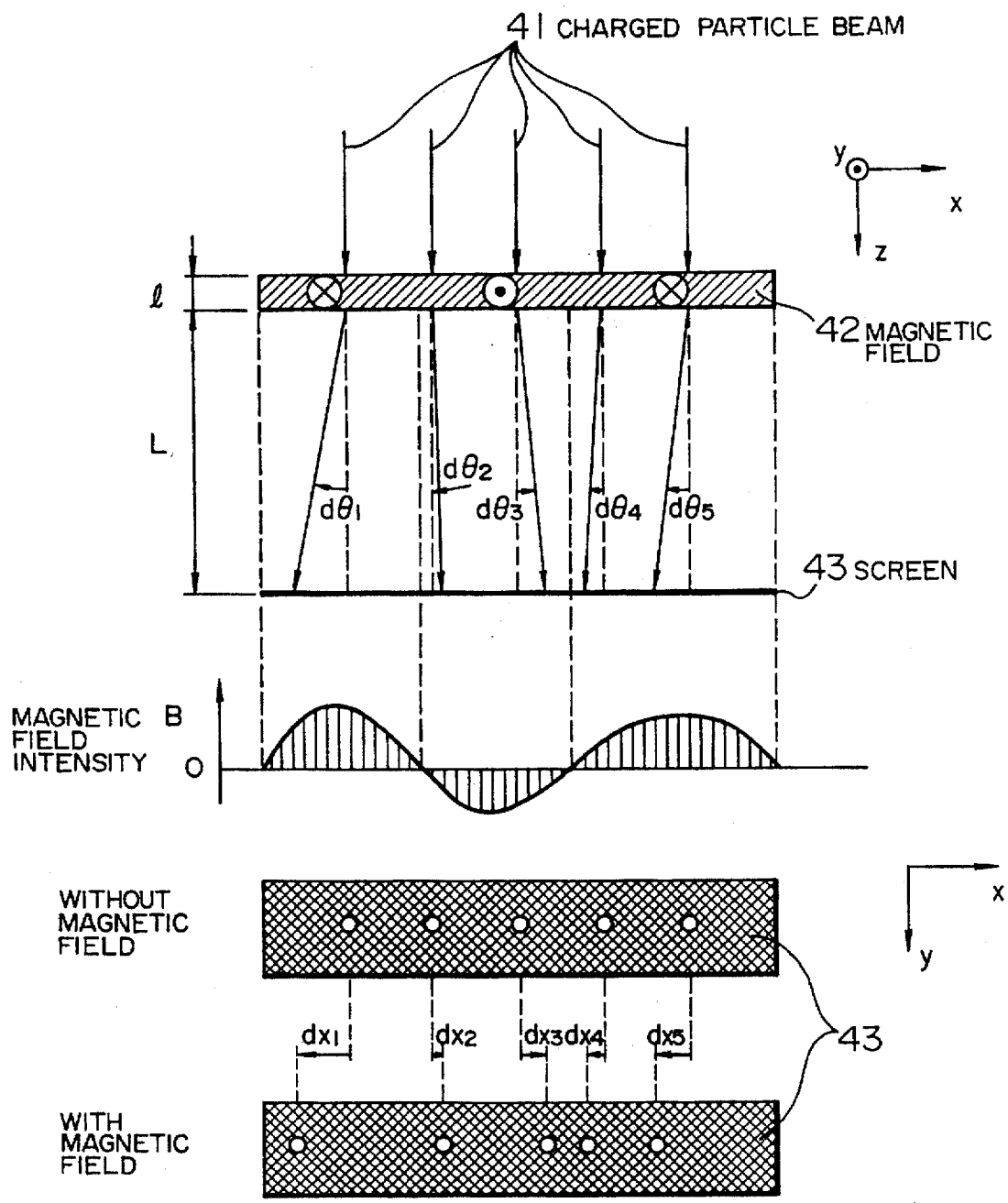
FIG. 3 is a diagram for explaining the image distortion due to a magnetic field.

The magnetic field distribution closest to a flat plane generating a magnetic field is measured from a bright field image of a film obtained by passing a charged particle beam through a film specimen and a bright field image distorted with a magnetic field to be measured arranged in the route of the charged particle beam that has been transmitted through the film. This embodiment is shown in FIG. 1. In this embodiment, an electron beam is used as the charged particle beam. A similar measurement is also possible using a dark field image although the explanation is made for the case using a bright field image.

In FIG. 1, an electron beam 12a is generated from an electron beam source 11, and is transmitted through a focusing lens 13 and further through a reference specimen 14 of a film. The electron beam 12b thus transmitted is applied through an object lens 15 to form a bright field image of the film on an image plane 24. The bright field image thus formed is enlarged by the desired magnification M through an intermediate lens 17 and a magnification lens 18 by a desired magnification M and picked up by a camera 19. The image thus picked up is stored in a memory 20 (201). This image is hereinafter called a reference image.

According to this embodiment, a magnetic head 25 is used as a specimen for generating a magnetic field 16 to be measured. With the air bearing surface of the magnetic head 25 set in parallel to the direction of progress of the electron beam, the magnetic head 25 is arranged at the position designated by 16a in FIG. 1, and driving means 26 is driven to generate a magnetic field. In the presence of a magnetic field to be measured, the transmitted electron beam 12b is subjected to Lorentz force and curved in the orbit thereof. As a result, the bright field image formed on the image plane 24 is distorted. The distorted image formed on the image plane 24 is enlarged by the desired magnification M through the intermediate lens 17 and the magnification lens 18, followed by being picked up by the camera 19. The image thus picked up is stored in the memory 20 (202) like the reference image. This image is hereinafter called the reference distorted image.

Figure 4A:
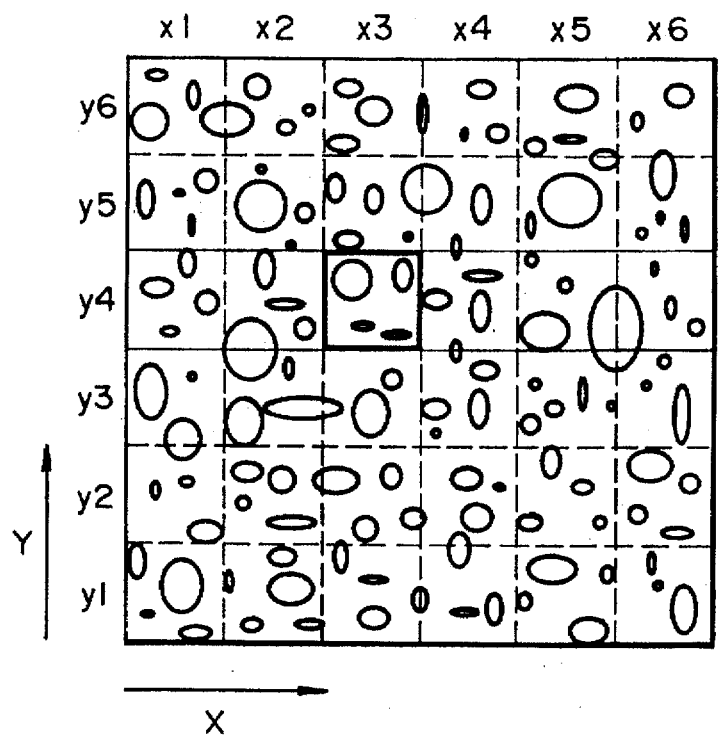
FIGS. 4A and 4B are diagrams showing an example of a reference image and a reference distorted image.
Figure 4B:
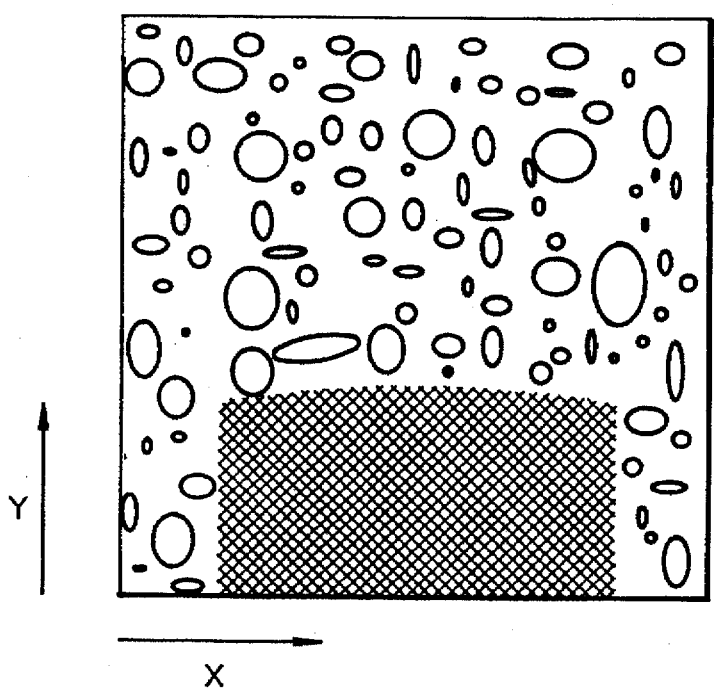

The images stored in the memory, as represented as a model, include a reference image as shown in FIG. 4A, and a reference distorted image as shown in FIG. 4B. The dashed line and the solid line in FIG. 4A, however, are added for the purpose of explanation and are not included in an actual image. The circles and ellipses of various sizes shown in FIGS. 4A and 4B represent particles of a reference specimen (14 in FIG. 1), and have no regularity in the arrangement or size of individual particles. The hatched position at the lower part of FIG. 4B represents the shadow of the magnetic head (25 in FIG. 1) installed. The particles shown in FIG. 4 are shown black in the outer positions and white in the internal positions. The following image processing is possible, however, even for the case where the particles are black inside or have brightness tones. An image of these particles can be easily obtained in the case where the material forming the particles is different from the material of the position where particles are not observed.

Then, the following process is effected at an image processing section 21. This will be explained with reference to FIG. 4. First, the reference image is segmented into small areas, each of which is studied. As shown in FIG. 4A, the reference image is segmented into six areas for both X and Y directions, each being designated x1 to x6 and y1 to y6 respectively. These small areas are defined by dashed lines and solid lines respectively. Each small area includes a plurality of circular or elliptic particles, whose size and shape lack regularity and whose arrangement is not periodic.

Figure 5:
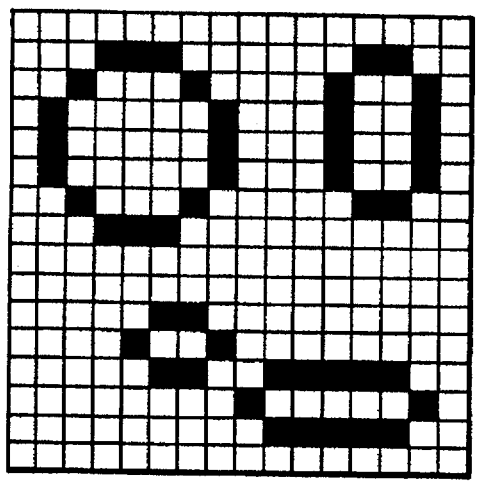
FIG. 5 is a diagram showing a template image quantized by the computer.

Then, this image is quantized by the computer and has the computer recognized in such a manner that a given small area corresponds to, say, 16×16 pixels. The computer was caused to recognize the whole images in FIGS. 4A and 4B with 96×96 pixels in all. In the reference image of FIG. 4A, consider a small area (hereinafter referred to as $T_{(3, 4)}$) for X of x3 and Y of y4. For this small area $T_{(3, 4)}$, each of 16×16 pixels is recognized by 1-bit data which is either 0 or 1. The image recognized by the computer is shown in FIG. 5. The white positions corresponds to 0 data, and the black positions 1 data.

As the next step, in the reference distorted image of FIG. 4B recognized earlier with 96×96 pixels, a point having a pattern resembling the pattern of FIG. 5 is searched for and the coordinate of the particular point is determined. In order to search for a point having the same pattern, a pattern matching described below is performed. According to this method, first, the small area T(3, 4) of the reference image is used as a template image, which is overlapped on a given area of the reference distorted image. The size of the area of a position where data of each pixel agree or disagree is determined. The overlapped area where the size takes a maximum or minimum value is assumed to be a position where the template image has moved to.

Figure 6:
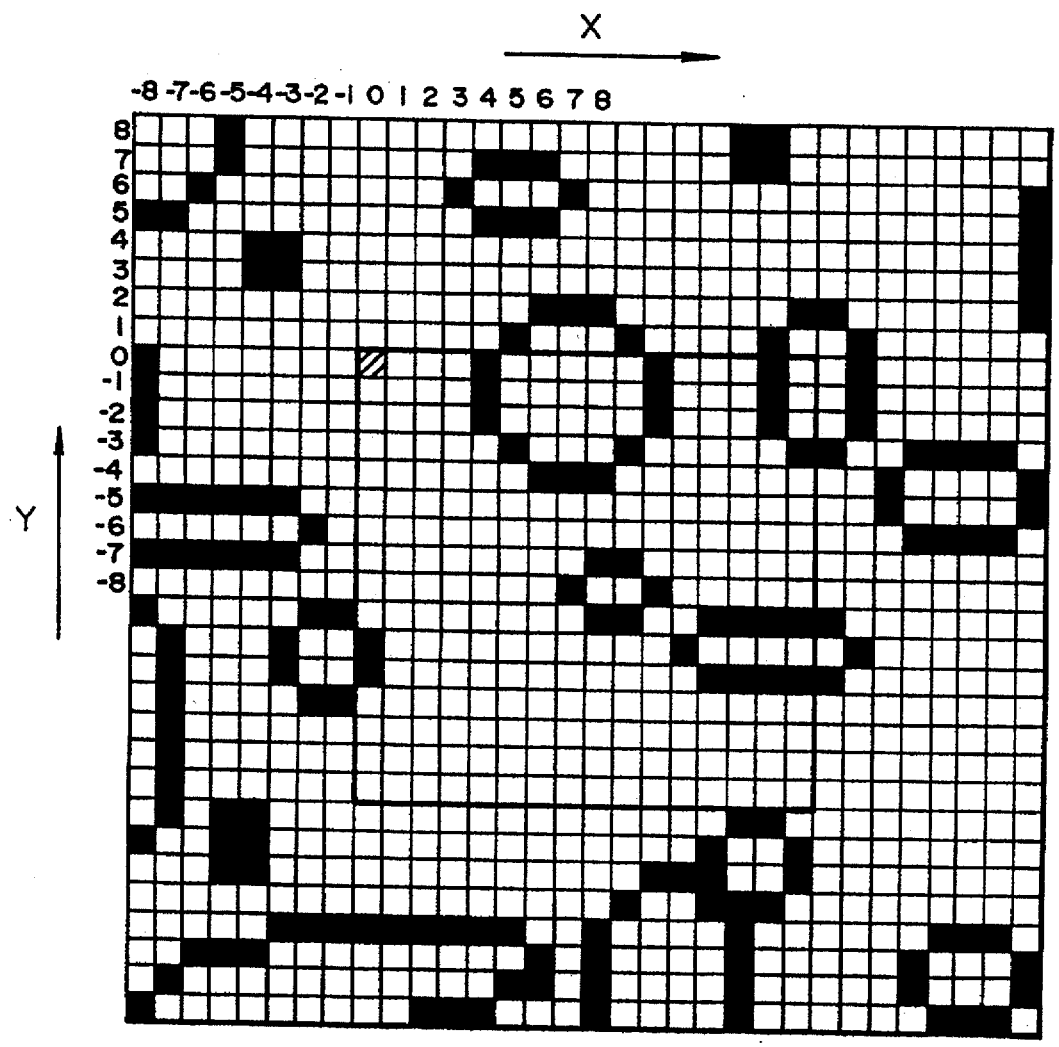
FIG. 6 is a diagram showing a matching image quantized by the computer.

According to the embodiment under consideration, the number of pixels on which data agree as 1 is counted instead of determining the area. In order to save the time required for matching process, on the other hand, the areas where matching is performed are limited to a range where the electron beam 12 is liable to be deflected. In the present case, the area is defined to the one covering ±8 pixels in X and Y direction from the position of the original template image. This area is quantized and the result of recognition is shown in FIG. 6. All the pixels required for matching the template image of 16×16 pixels in the range of ±8 pixels are 32×32. The areas defined by thick solid lines in FIG. 6 are where a template of the reference image is located in the absence of a magnetic field to be measured.

In order to designate by coordinate the overlapped position of the template image on a reference distorted image, an upper left pixel position is used as a reference. According to this embodiment, the same point where the template image first existed on the reference image is searched for on the reference distorted image, and the coordinate of the upper left pixel of the template image thus overlapped is designated (0, 0). This template image is moved by ±8 pixels in X and Y directions, and the number of pixels on which data 1 agrees between them is counted. The coordinate is shown at the upper left position in FIG. 6. Also, the result of counting is shown in Table 1.

TABLE 1

| Y\X | -8 | -7 | -6 | -5 | -4 | -3 | -2 | -1 | 0 | 1 | 2 | 3 | 4 | 5 | 6 | 7 | 8 |
|---|---|---|---|---|---|---|---|---|---|---|---|---|---|---|---|---|---|
| 8 | 7 | 6 | 6 | 8 | 7 | 5 | 5 | 4 | 6 | 12 | 9 | 5 | 6 | 7 | 4 | 3 | 7 |
| 7 | 4 | 3 | 3 | 6 | 6 | 4 | 4 | 9 | 7 | 5 | 5 | 6 | 6 | 6 | 4 | 5 | 4 |
| 6 | 6 | 5 | 6 | 6 | 3 | 4 | 6 | 4 | 8 | 11 | 8 | 4 | 4 | 4 | 4 | 5 | 7 |
| 5 | 6 | 5 | 5 | 5 | 7 | 7 | 8 | 9 | 8 | 7 | 10 | 13 | 9 | 7 | 6 | 5 | 4 |
| 4 | 6 | 7 | 5 | 4 | 4 | 6 | 8 | 5 | 9 | 10 | 10 | 10 | 10 | 8 | 7 | 5 | 5 |
| 3 | 4 | 7 | 4 | 4 | 7 | 7 | 3 | 9 | 10 | 8 | 16 | 46 | 16 | 8 | 11 | 11 | 5 |
| 2 | 7 | 7 | 6 | 5 | 5 | 3 | 5 | 5 | 7 | 8 | 10 | 10 | 10 | 12 | 11 | 6 | 10 |
| 1 | 5 | 9 | 6 | 5 | 4 | 3 | 4 | 5 | 6 | 7 | 9 | 13 | 11 | 9 | 10 | 11 | 10 |
| 0 | 9 | 9 | 6 | 4 | 5 | 2 | 4 | 3 | 3 | 4 | 4 | 3 | 8 | 9 | 8 | 8 | 10 |
| -1 | 6 | 3 | 6 | 7 | 4 | 4 | 2 | 3 | 2 | 4 | 4 | 4 | 5 | 7 | 7 | 11 | 6 |
| -2 | 5 | 7 | 8 | 7 | 5 | 5 | 2 | 0 | 3 | 6 | 6 | 5 | 10 | 7 | 5 | 7 | 8 |
| -3 | 4 | 6 | 6 | 7 | 8 | 5 | 1 | 4 | 5 | 5 | 8 | 9 | 5 | 5 | 8 | 6 | 5 |
| -4 |   | 5 | 6 | 5 | 5 | 5 | 9 | 6 | 6 | 10 | 9 | 6 | 6 | 8 | 5 | 7 | 9 |
| -5 | 4 | 5 | 7 | 7 | 6 | 6 | 7 | 7 | 9 | 10 | 12 | 7 | 7 | 4 | 9 | 9 | 5 |
| -6 | 13 | 10 | 5 | 6 | 9 | 7 | 8 | 10 | 8 | 11 | 9 | 7 | 10 | 12 | 8 | 6 | 10 |
| -7 | 7 | 5 | 5 | 5 | 7 | 8 | 7 | 8 | 8 | 8 | 10 | 11 | 9 | 7 | 10 | 10 | 8 |
| -8 | 13 | 10 | 11 | 12 | 11 | 8 | 8 | 8 | 8 | 6 | 8 | 8 | 7 | 11 | 7 | 7 | 8 |

This table indicates that the point reached by moving by three pixels in positive direction along X and by three pixels in positive direction along Y has the greatest number of pixels that agree. This in turn shows that the area $T_{(3, 4)}$ in FIG. 4A has moved by three pixels in positive direction along X and by three pixels in positive direction along Y due to the image distortion caused by the magnetic field. This fact is used to determine the direction of deflection and the displacement of the electron beams.

The distance covered by $T_{(3, 4)}$ is assumed as dq, the magnification of the image plane (24 in FIG. 1) formed under the magnetic field as M and the distance to the nearest image-forming plane from the magnetic field as 1. Then the deflection angle is approximately determined as $$d\theta = \arctan\left(\frac{dq}{M1}\right) \quad (1)$$

This template matching process is performed for each direction in which the desired cross section is projected. In the case where measurement of a cross section along X direction is desired, for example, the matching process is performed for $T_{(1, 4)}$ to $T_{(6, 4)}$ respectively in FIG. 4. Assuming that the distance coverage of each small area is $dq(T_{(n, 4)})$ (n=1, . . . ,6), the deflection angle $d\theta(T_{(n, 4)})$ is given as $$d\theta(T_{(n,4)}) = \arctan\left(\frac{dq(T_{(n,4)})}{M1}\right) \quad (2)$$

Next, the magnetic field to be measured is rotated about an axis perpendicular to the cross section of which measurement is desired to produce reference distorted images projected from various angles. Thus, the above-mentioned processing for determining the deflection angle is conducted. In order to change the direction of progress of the electron beams with respect to the magnetic field, the apparatus according to this embodiment comprises a mechanism for rotating a specimen which generates a magnetic field to be measured. The measurement is thus made by rotating the magnetic field to be measured. When images projected from various angles are produced, both a reference image and a reference distorted image may be obtained, or only a reference distorted image may be obtained while a reference image obtained and stored in the first process may be used.

After rotation by $\Omega_m$ from the angle of the electron beam formed with the magnetic field first measured, the deflection angle of the electron beam is expressed as $$d\theta(\psi_m, T_{(n,4)}) = \arctan\left(\frac{dq(\psi_m, T_{(n,4)})}{M1}\right) \quad (3)$$

The deflection angle data $d\theta(\psi_m, T_{(n, 4)})$ of the electron beams obtained by this measurement and calculation are assumed to be projection data indicating the linear integral value of the magnetic field. These projection data are processed at a computer tomography operating section 22 to produce a cross-section distribution of the magnetic field. The computer tomography is a technique for determining a tomographic image by computation from the projection data in various angular directions of a cross-section.

Further, these images are processed with the data along Y direction changed thereby to determine magnetic fields at various heights from the flat surface of the magnetic head. FIG. 7 shows a result of an example measurement. In this case, the measuring plane is assumed to be the X-Y coordinate with the height represented by the Z coordinate. The magnetic field intensity along X direction is observed to weaken for a plane far from a magnetic head pole 51.

The spatial resolution for measurement is determined by the size of the magnetic field area of a template image used for image processing. According to this embodiment, an image position having an area of 30 μm square obtained is used as a template image. The magnification of the intermediate lens 27 and the magnification lens 18 in FIG. 1 is 3000×. The spatial resolution according to the present embodiment therefore is 10 nm capable of realizing measurement with a high spatial resolution. Also, the image processing is possible at a position 30 μm or less away from the magnetic head specimen surface, and therefore the measurement as closest to the specimen as 10 nm or less could be realized. Furthermore, according to this technique, a chronologically-changing magnetic field can also be measured using an electron beam in stroboscopic form.

(Second embodiment)

According to the first embodiment described above, the displacement of charged particle beams was extracted from an image in the absence of a magnetic field and an image in the presence of a magnetic field. In the present embodiment, by contrast, only a plurality of images in the presence of a magnetic field are obtained, and using these images, the displacement of the charged particle beams is extracted.

Figure 8:
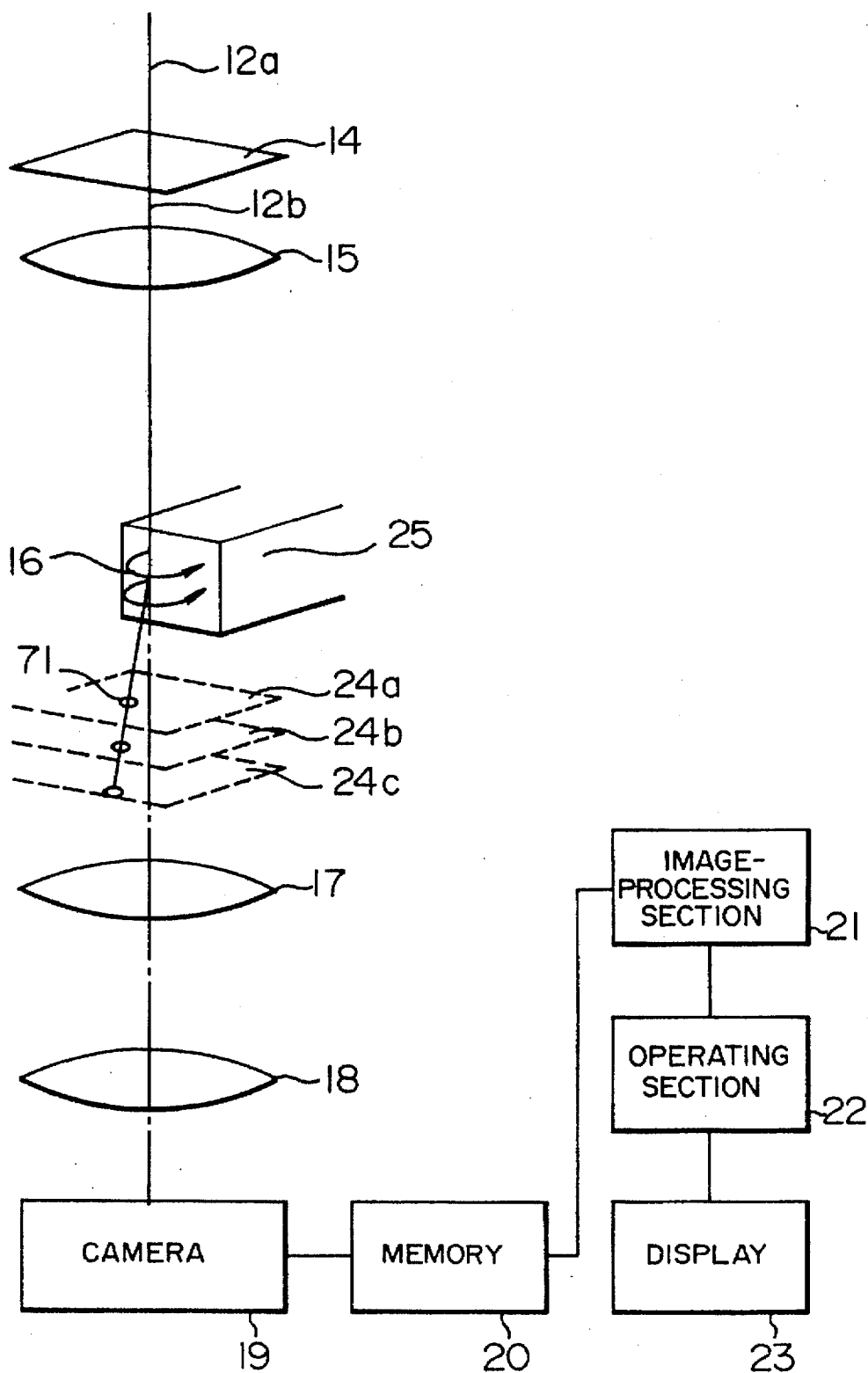
FIG. 8 is a diagram showing an example image for explaining a second embodiment of the invention.

A diagram for explaining the present invention is shown in FIG. 8. An electron beam 12a is used as a charged particle beam. An electron beam 12b that has been transmitted through a reference film 14 forms by way of an object lens 15 an image plane 24a in the neighborhood of a magnetic head 25 for generating a magnetic field 16. The image plane 24a is enlarged to a desired magnification by an intermediate lens 17 and a magnification lens 18, and an enlarged image of the image plane is obtained on a camera 19. This image is stored in a memory 20.

The distance between the image plane 24a and the magnetic field 16 is changed. The image plane 24a is moved to 24b, for example, to produce an enlarged image of the image plane in a manner similar to the above-mentioned method. In the process, the intensity of the magnetic field to be measured is held unchanged. The image plane may be moved while changing the strength of the object lens 15 or the intermediate lens 17. Alternatively, the magnetic head 25 for generating the magnetic field 16 may be moved. A certain pattern 71 is paid attention in the image thus projected. A single particle is considered in this case. When the magnetic field is parting away from the image plane, continuous observation of the image shows that the particle involved moves as if remaining in a plane. This is due to the fact that an electron beam containing particle information develops a deflection angle by the magnetic field, so that the farther the electron beam moves away from the magnetic field, the greater the displacement observed in a plane. By determining the distance covered by the particle, the deflection angle of the electron beam is determined.

The deflection angle of the electron beam is extracted using an image formed at a plurality of points as shown in FIG. 8. A single particle in the image plane 24a nearest to the magnetic field is considered in determining the orbit of the electron beam passing through the particular particle using other image planes 24b, 24c. The orbit of the electron beam is assumed as a straight line in a three-dimensional space and is determined by a method for determining a parameter to determine a linear equation from other images.

In this method of extraction, in order to determine the orbit of a particle, unlike in the first embodiment, particles may be arranged regularly with uniform particle sizes. Also, the spatial resolution corresponds to the size of a particle. As a result, as compared with the method using the pattern matching described with reference to the first embodiment, the displacement with an even higher spatial resolution can be extracted. The process after extracting the displacement can be performed in the same manner as in the first embodiment.

For the image under consideration, the method in the first embodiment can be used for extracting the deflection angle. In this case, an area containing a plurality of particles is considered in determining the deflection angle θ as θ=arctan $(p/z_d)$, where p is the distance covered in the plane of the pattern involved and zd the difference of distance of the image plane used for matching from the magnetic field.

(Third embodiment)

Figure 9:
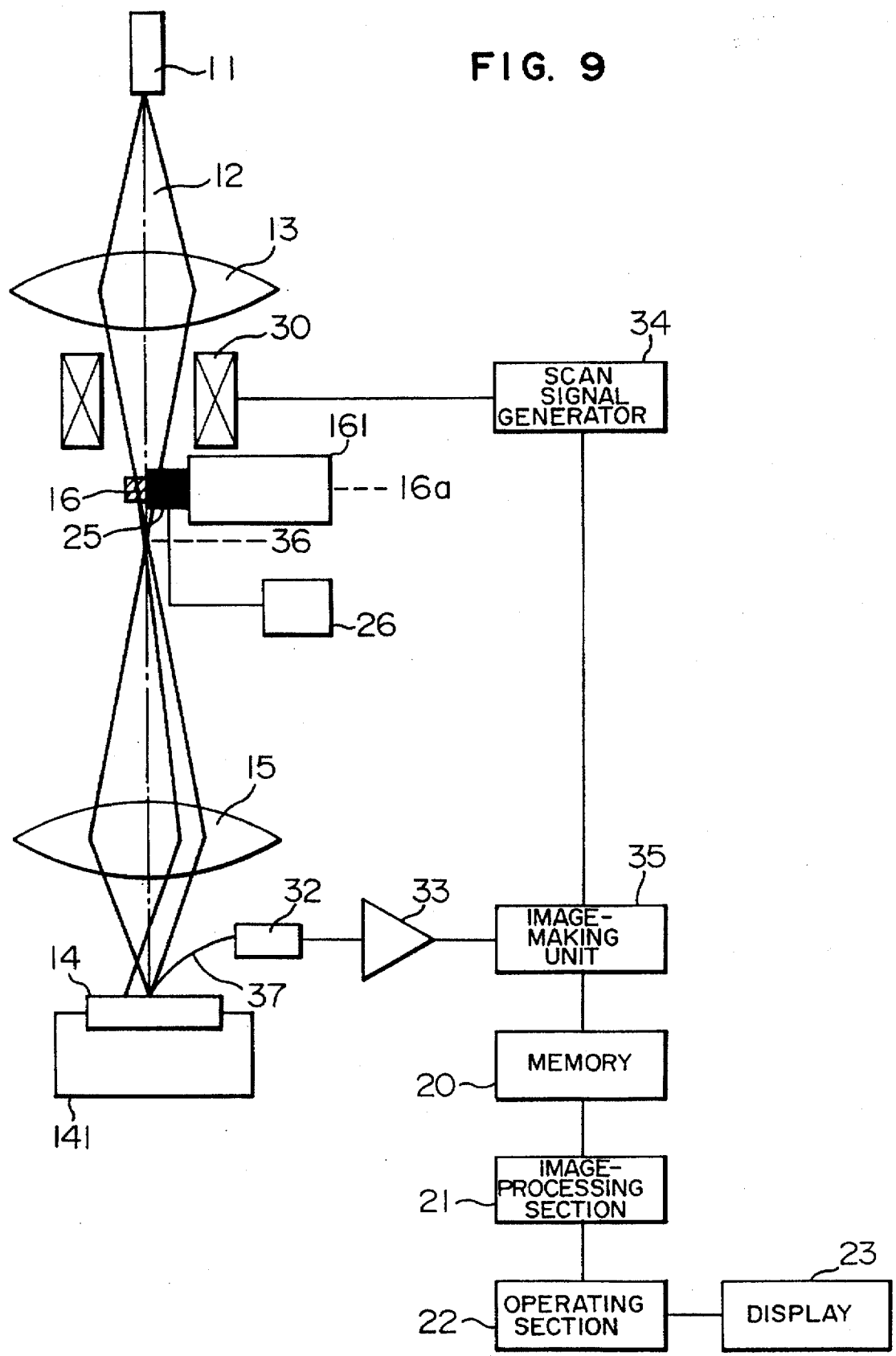
FIG. 9 is a diagram showing a third embodiment of the invention.
Figure 10A:
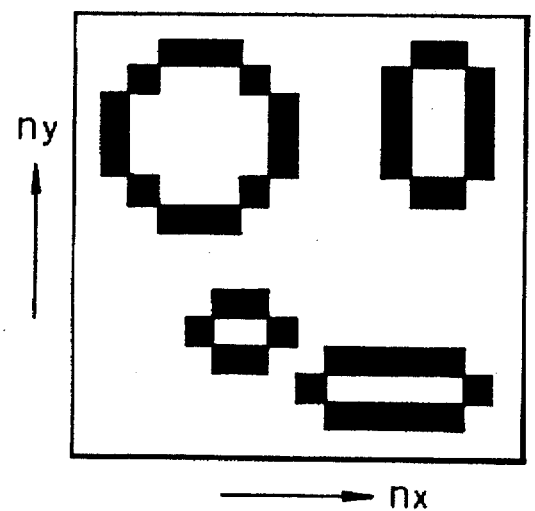
FIGS. 10A to 10D are diagrams showing an example image for explaining a sixth embodiment of the invention.
Figure 10B:
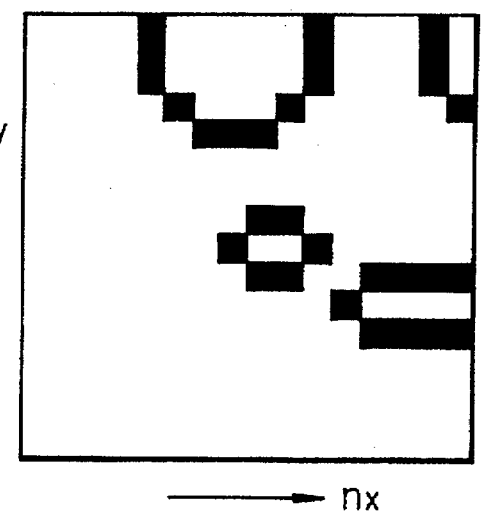
Figure 10C:
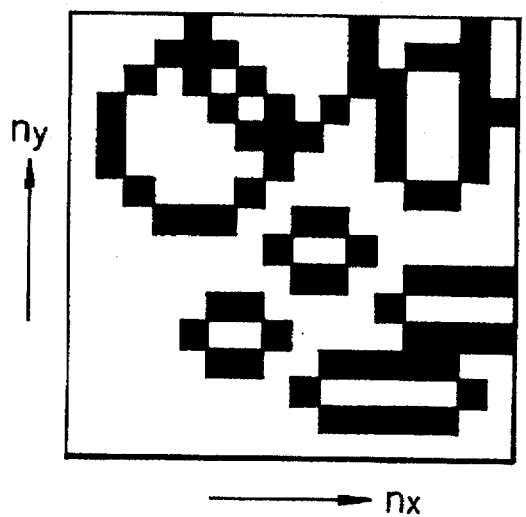
Figure 10D:
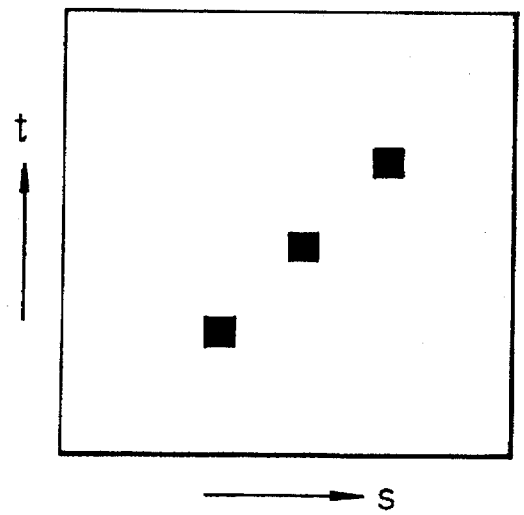

A focused charged particle beam is applied to and scanned on a reference specimen, and a specimen image is obtained from the secondary electrons or the reflected charged particles, thus realizing the measurement of the magnetic field. FIG. 9 shows the third embodiment. As in the first embodiment, an electron beam is used as a charged particle beam.

In FIG. 9, an electron beam 12 generated from an electron beam source 11 passes through a focusing lens 13 and forms a crossover point at 36. Further, the electron beam passes through an object lens 15 and is irradiated on a reference specimen 14. With the electron beam irradiated on the specimen surface, secondary electrons 37 are generated from the same surface. The secondary electrons 37 thus generated from the specimen are detected by a secondary electron detector 32 and amplified by an amplifier 33. On the other hand, a scan signal generator 34 sends a scan signal to a scan deflector 30, so that the electron beam 12 is scanned on the surface of the reference specimen 14. This scan signal is sent also to a unit 35 which makes images. The image-making unit 35 synchronizes the amplified secondary electron signal with the scan signal and makes a contrast image of the reference specimen 14 due to the difference in shape or material. The secondary electron image of the reference specimen 14 is stored as image data in a memory 20, and is used as a reference image.

As the next step, the magnetic field 16 to be measured is arranged at point 16a in FIG. 9. In the presence of a magnetic field, the orbit of the electron beam is curved under Lorentz force, and the point of arrival of the electron beam is displaced on the surface of the reference specimen 14. As a consequence, the scanning point of the electron beam on the reference specimen 14 is locally different from the point of the electron arrival, with the result that the image constructed by the image-making unit 35 is distorted in its entirety. This image is stored in the memory 20 as a reference distorted image.

The image processing described below is the same as that according to the first embodiment, and is used to determine the displacement and the deflection angle of the electron beam 12. Further, as in the first embodiment, the magnetic head 25 providing a specimen is rotated to produce an image in a manner similar to the one described above. The deflection angle of the electron beam is extracted also from these images, and so is the projection data of the magnetic field. These projection data are processed by the computer tomography processing section 22 to determine a magnetic field distribution.

Also, according to the present embodiment, a specimen having an unevenness of the surface irradiated with the electron beam 12 is used as the reference specimen 14. This specimen unevenness is produced by the secondary electron detector 32 in terms of differences in strength of the secondary electrons 37 generated by scanning the electron beam 12 on the specimen surface. As a result, the unevenness is observed as a contrast difference in the image constructed by the image-making unit 35. The unevenness of the surface of the reference specimen 14 is irregular so that no periodicity is observed by scanning the electron beam 12 on the specimen from whatever direction. Further, as in the first embodiment, according to the present embodiment, the electron beam in stroboscopic form can be used for measuring the magnetic field changing with time. Also, the use of the apparatus configuration described in the present embodiment eliminates the need of transmitting a charged particle beam through a reference specimen. Unlike in the first or second embodiment, therefore, a thick reference specimen can be used.

The apparatus having the configuration according to this embodiment is capable of measuring the magnetic field using the same technique as in the second embodiment. This is a method for producing a plurality of images in the presence of a magnetic field and extracting the displacement of the electron beam. In the case of this apparatus, a plurality of images were taken while changing the crossover point 36 and the position of the magnetic field 16. The image thus obtained is processed by the same method as in the second embodiment.

(Fourth embodiment)

According to the first embodiment, the image of a reference thin film specimen is recognized by quantizing each pixel into 0 or 1 data in the image processing stage. In the case where the reference image and the reference distorted image cannot be quantized into 0 or 1 data, that is, in the case where the brightness data of each pixel is in more than two bits, the following method can be employed as a means for determining the deflection angle of the charged particle beam.

In the case where an image is quantized and recognized by computer, for example, an image is recognized with the data of each pixel not as 0 or 1 but as numerical data in 8 bits, i.e., in 256 tones. This process is performed for both the reference image and the reference distorted image to store the images in a memory. Then, a small area, such as of $Nx \times Ny$ pixels, is extracted as a template image from the reference image stored in memory. An examination area larger than the template image, such as of $Mx \times My$ pixels, is set in the reference distorted image and extracted. The size relation is $Nx < Mx$ and $Ny < My$.

A position most agreeing with the template of the reference image is looked for in the examination area of the reference distorted image. This operation is performed by the following calculation:

$$D(a,b) = \sum_{n_x=0}^{N_x-1} \sum_{n_y=0}^{N_y-1} |H_{(a,b)}(n_x,n_y) - T(n_x,n_y)| \quad (4)$$

where (a, b) is the coordinate of the template image as overlapped in the examination area in the reference distorted image, that is, the position of overlapping. According to this embodiment, this coordinate is represented by the point where the upper left pixel of the template image is placed in the examination area. $H_{(a,b)}$ designates the tone of the pixel of the reference distorted image at the same point as the overlapped template image, and T is the grade of the pixel of the template image. Equation 4 is for adding the absolute values of the difference in pixel data which have been appropriately studied between the overlapped two images over the whole examination area. The point (a, b) of the template image associated with a minimum value of $D(a, b)$ represents a point where the images agree the most. In the case where the same images are overlapped in completely agreed fashion, $D(a, b)=0$.

According to the embodiment under consideration, values of $D(a, b)$ for various values of (a, b) are determined using Equation 4. From the value (a, b) associated with a minimum value of $D(a, b)$, a point where the template image of the reference image is assumed to have moved is determined on the reference distorted image. The distance covered is used as the displacement of the electron beam and further for determining the deflection angle.

Then, a template image is extracted for each cross section to be measured for all the images retrieved, and the calculation is made according to Equation 4 to determine the destination of the template image. The displacement and the deflection angle of the electron beam due to the magnetic field are thus determined. Also, a similar calculation is made for the images picked up from each direction of the magnetic field, thus determining the displacement and the deflection angle of the electron beam thereby to produce projection data of the magnetic field. Further, in order to determine a distribution of magnetic field, the calculation using the computer tomography technique is made in the same manner as in the first and second embodiments.

The calculation of Equation 4 is for making addition for all the pixels. This calculation is also conducted for various values of (a, b) in an examination area. When a large number of pixels $Mx \times My$ is taken for an examination area, therefore, the calculation time posed a problem. In view of this, in order to reduce the required calculation time of Equation 4, the following measure is taken. First, during the process of sequential addition for the pixels according to Equation 4, a slice level Ds is set for $D(a, b)$. During the calculation, $D(a, b)$ is compared sequentially with Ds. When $D(a, b)$ becomes larger than Ds, the calculation of Equation 4 is stopped even in the middle of the process. As a result, the calculation time is reduced by about 10 to 30 percent for matching of images having data of more than two bits. The calculation time is reduced also by sequentially replacing Ds with a minimum value Dmin of $D(a, b)$ instead of keeping a constant value of Ds, and making the above-mentioned comparison.

Further, as another method of reducing the calculation time, the change rate $\Delta D(a, b)$ is sequentially observed during the addition. In the case where $\Delta D(a, b)$ sharply increases, the calculation is moved to the next overlapped area even before completion of the calculation of Equation 4 for the current area. This method is also effective in reducing the calculation time by 10 to 30 percent as in the aforementioned case.

(Fifth embodiment)

According to this embodiment, the following technique is used for pattern matching in the image processing to determine the displacement of charged particle beams. As in the fourth embodiment, $Nx \times Ny$ pixels each providing data of more than two bits are used as a template image extracted from a reference image. $Mx \times My$ pixels providing an examination area are set and extracted from a reference distorted image.

Calculation is made according to Equation 5.

$$C(a,b) = \sum_{n_x=0}^{N_x-1} \sum_{n_y=0}^{N_y-1} \frac{\{H_{(a,b)}(n_x,n_y) - \overline{H}\}\{T(n_x,n_y) - \overline{T}\}}{\sqrt{H_{a\sigma b} T_\sigma}} \quad (5)$$

where $$\overline{H} = \frac{1}{N_x N_y} \sum_{n_x=0}^{N_x-1} \sum_{n_y=0}^{N_y-1} H_{(a,b)}(n_x,n_y) \quad (6)$$

-continued $$\bar{T} = \frac{1}{N_x N_y} \sum_{n_x=0}^{N_x-1} \sum_{n_y=0}^{N_y-1} T(n_x, n_y) \quad (7)$$

$$H_{\sigma ab} = \sum_{n_x=0}^{N_x-1} \sum_{n_y=0}^{N_y-1} \{H_{(a,b)}(n_x, n_y) - \bar{H}\}^2 \quad (8)$$

and $$T_\sigma = \sum_{n_x=0}^{N_x-1} \sum_{n_y=0}^{N_y-1} \{T(n_x, n_y) - \bar{T}\}^2 \quad (9)$$

As in the third embodiment, (a, b) designates the coordinate of the template image overlapped on an examination area in the reference distorted image, i.e., an overlapped point. In this case, the template image coordinate is represented by the coordinate of the point where the upper left pixel of the template image is placed in the examination area. The character H(a, b) designates the tone of the pixel of the reference distorted image at the same point as where the template image is overlapped, and T the tone of the pixel of the template image. According to this embodiment, in Equation 5, the coordinate (a, b) of the template image associated with the maximum value of C(a, b) is determined. Also, the displacement of the electron beam is determined from the point where the template image of the reference image moved on the reference distorted image. The process after determining the displacement of the electron beam can be performed in the same manner as in the first embodiment.

(Sixth embodiment)

This embodiment uses the image processing applying the two-dimensional Fourier transform for extracting the displacement of the electron beam 12 of FIG. 9 or the transmitted electron beam 12b of FIGS. 1 and 8 from a reference image and a reference distorted image retrieved into the memory 20 shown in FIGS. 1, 8 and 9. When this image processing method can be used, the size of the area subjected to Fourier transform, the spatial resolution and the dynamic range of the magnetic field thereof satisfy the following relation.

When cutting out a region for Fourier transform from a reference image or a reference distorted image retrieved, the size of the region is required to be smaller than the required spatial resolution d. Assuming that the length of a side of such region is $l_s$, the relation holds that $l_s \leq d \times M$ (M: magnification). On the other hand, assume that the maximum value of the amount of displacement of the electron beam in X and Y directions due to the magnetic field, i.e., the dynamic range is $l_{mx}$ and $l_{my}$ respectively. In a case where the $l_{mx}$ and $l_{my}$ are both longer than one half of the $l_s$ representative of a length of a side of the particular region, the present method is not available. In other words, both the relations $l_{mx} \leq l_s/2$ and $l_{my} \leq l_s/2$ are required to be satisfied.

When the above-mentioned conditions are satisfied, the template image smaller than the spatial resolution that has been cut out of the reference image is assumed to be $T(n_x, n_y)$ and the image of the reference distorted image of the same size for the same point as $H(n_x, n_y)$. First, the image synthesized from the two images is assumed to be $f(n_x, n_y) = T(n_x, n_y) + H(n_x, n_y)$, and the calculation is made according to Equations 10 and 11 for this composite image.

$$F(u,v) = \left| \sum_{n_x=0}^{N_x-1} \sum_{n_y=0}^{N_y-1} f(n_x, n_y) \exp\left\{ -2\pi i \left( \frac{n_x u}{N_x} - \frac{n_y v}{N_y} \right) \right\} \right| \quad (10)$$

$$G(s,t) = \left| \sum_{u=0}^{N_x-1} \sum_{v=0}^{N_y-1} F(u,v) \exp\left\{ -2\pi i \left( \frac{us}{N_x} - \frac{vt}{N_y} \right) \right\} \right| \quad (11)$$

Equations 10 and 11 are equivalent to the calculations of the amplitude of the two-dimensional Fourier transform for $f(n_x, n_y)$ and $F(u, v)$ respectively. Also, Equations 10 and 11 may alternatively be squared to determine the power spectrum of Fourier transform.

An example of the calculation result is shown in FIG. 10. $T(n_x, n_y)$ is represented in FIG. 10A, $H(n_x, n_y)$ in FIG. 10B, and $f(n_x, n_y)$ in FIG. 10C. FIG. 10D is a diagram showing three points of largest values extracted from the calculation result of Equation 11, indicated as black spots. The central plotted point represents the direct-current component of an image, and the plotted points at the upper right and the lower left represent the primary frequency component. These primary frequency point represent the magnitude and direction of the displacement between the overlapped images $T(n_x, n_y)$ and $H(n_x, n_y)$. Which of the two points of primary frequency component shown in FIG. 10D represents the deflection point of the electron beam is decided by visual comparison between the reference image and the reference distorted image or by auxiliary use of the method described above with reference to the first, fourth and fifth embodiments. The processing after determining the displacement of the electron beam is performed in the same manner as in the first embodiment, thereby realizing the measurement of the magnetic field distribution with high resolution and high sensitivity.

(Seventh embodiment)

According to this embodiment, the magnetic field is measured using a charged particle source in planar form. Also, this embodiment uses a planar electron beam source as the planar charged particle source.

Figure 11:
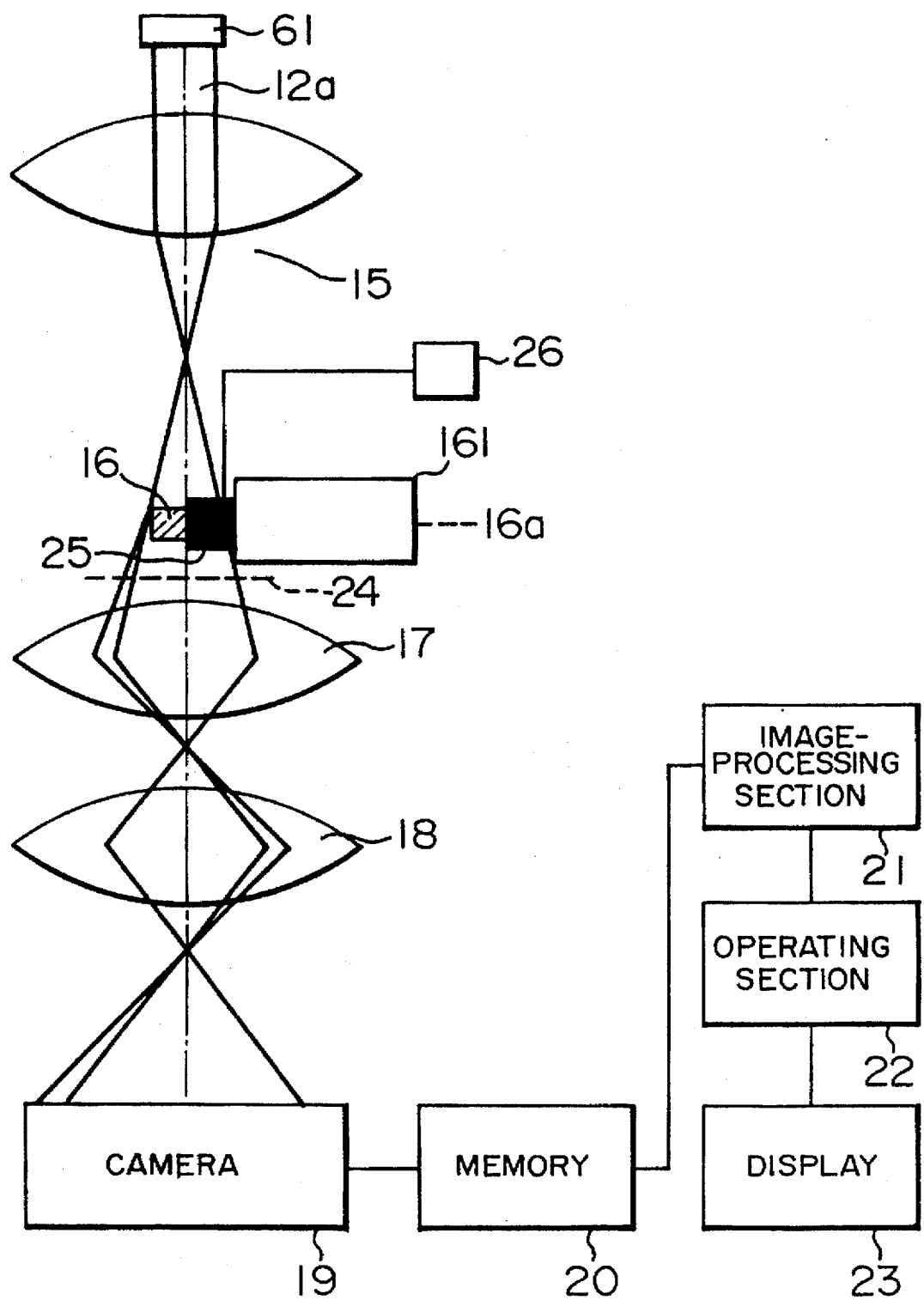
FIG. 11 is a diagram showing an example image for explaining a seventh embodiment of the invention.

The embodiment is shown in FIG. 11. In this embodiment, as shown in FIG. 11, a planar electron beam source 61 is arranged above a magnetic field 16. The planar electron beam source 61, as observed in the plane, has a difference in the density of electrons generated at different points, and when an image is formed in plane, a light and shade pattern can be obtained. This electron beam is distorted by the magnetic field 16 to produce a distorted pattern, whereby the displacement of the spatial electron beam is determined. The displacement of spatial electrons is determined in the same manner as in the first, second, fourth, fifth and sixth embodiments.

The use of the electron beam source according to this embodiment eliminates the need of installing a reference film described with reference to the aforementioned embodiments, thereby reducing the size of the apparatus as a whole.

(Eighth embodiment)

According to this embodiment, deflection points of a charged particle beam are measured by moving two-dimensionally a detector capable of detecting each deflection point of the charged particle point in the direction of progress of the charged particle beam. These deflection points are used to determine the deflection angle of the charged particle beam due to the magnetic field and the electric field. The following is a description of the case in which an electron beam is used as a charged particle beam and the object of measurement is a magnetic field.

Figure 12:
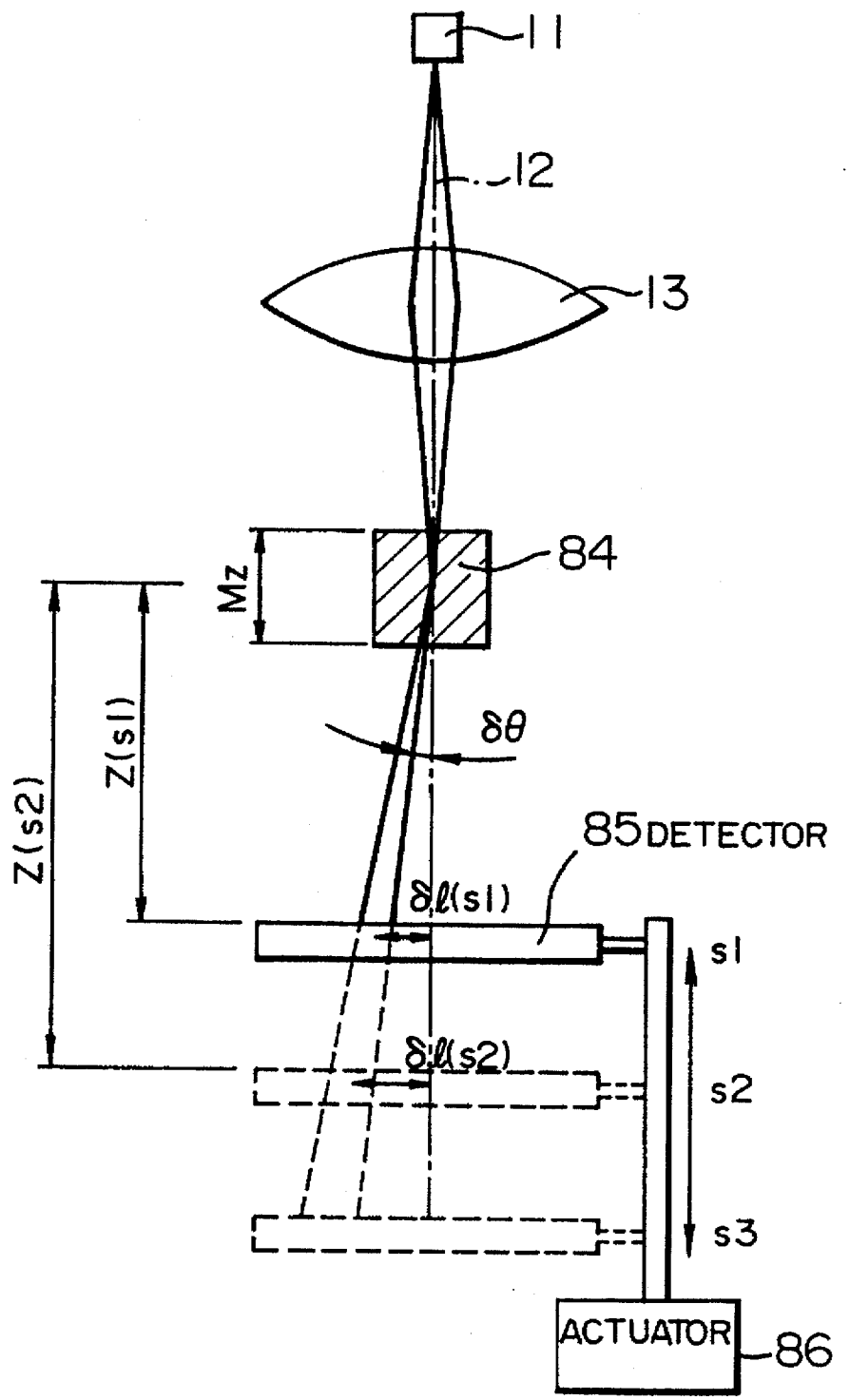
FIG. 12 is a diagram for explaining an eighth embodiment of the invention.

This embodiment will be explained with reference to FIG. 12. In FIG. 12, an electron beam 12 generated from an electron beam source 11 is focused by a focusing lens 13 and passed through a deflection region 84 existing with the magnetic field. The electron beam 12 develops a deflection angle δθ under Lorentz force, and is irradiated on a detector 85 placed at point s1. The detector 85 measures the displacement δl (s1) of the electron beam 12.

The linear integral value S of the desired magnetic field is given as $$S = \int B dz \quad (12)$$

where B is the magnetic field and z is the route of the electron beam. The deflection angle δθ of the electron beam is expressed as $$\delta\theta = (q/m)(\int B dz/Vz) \quad (13)$$

where δθ is the deflection angle of the electron beam, q is the charge of the electron beam, m is the mass of the electron beam and vz is the velocity of the electron beam. When the linear integral value of the magnetic field is expressed by the deflection angle, the following equation is obtained from Equations 12 and 13.

$$S = (m/q)\delta\theta \cdot Vz \quad (14)$$

The deflection angle δθ of the electron beam is given as $$Mz \ll Z(s1) \quad (15)$$

where Mz is the length along the direction of progress of the electron beam in the magnetic field and Z(s1) the distance from the magnetic field region to the detector. Then, $$\delta\theta = \arctan\{\delta l/Z(s1)\} \quad (16)$$

It is thus possible to determine the deflection angle δθ indicating the linear integral value of the magnetic field from the displacement δl(s1) of the electron beam measured by the detector 85.

In the case where Equation 15 is not established, i.e., in the case where Mz is of a size not negligible as compared with Z(s1), however, the correct deflection angle δθ cannot be obtained solely from the displacement δl(s1). For example, the deflection angle remains the same (θa=θb) but different displacements are observed (δa≠δb) between the case in which a large deflection occurs in the region r as shown in FIG. 13A and the case in which a large deflection occurs in the region s as shown in FIG. 13B.

In order to avoid this phenomenon to extract an always correct deflection angle, the following measurement is performed. First, in FIG. 12, provision is made to move the detector 85 from position s1 in the direction parallel to the progress of the electron beam 12a before deflection by means of an actuator 86. Using this means, the detector 85 is moved to position s2 and the displacement is measured again. Assuming the distances of the detector from the magnetic field are Z(s1), Z(s2), and the displacements detected are δl(s1), δl(s2). The deflection angle δθ can be determined correctly as $$\delta\theta = \arctan[\{\delta l(s2) - \delta l(s1)\}/\{Z(s2) - Z(s1)\}] \quad (17)$$

In view of the fact that the deflection angle δθ can be determined correctly from Equation 17, the linear integral value of the magnetic field can be measured correctly even when Equation 15 fails to hold.

Figure 14:
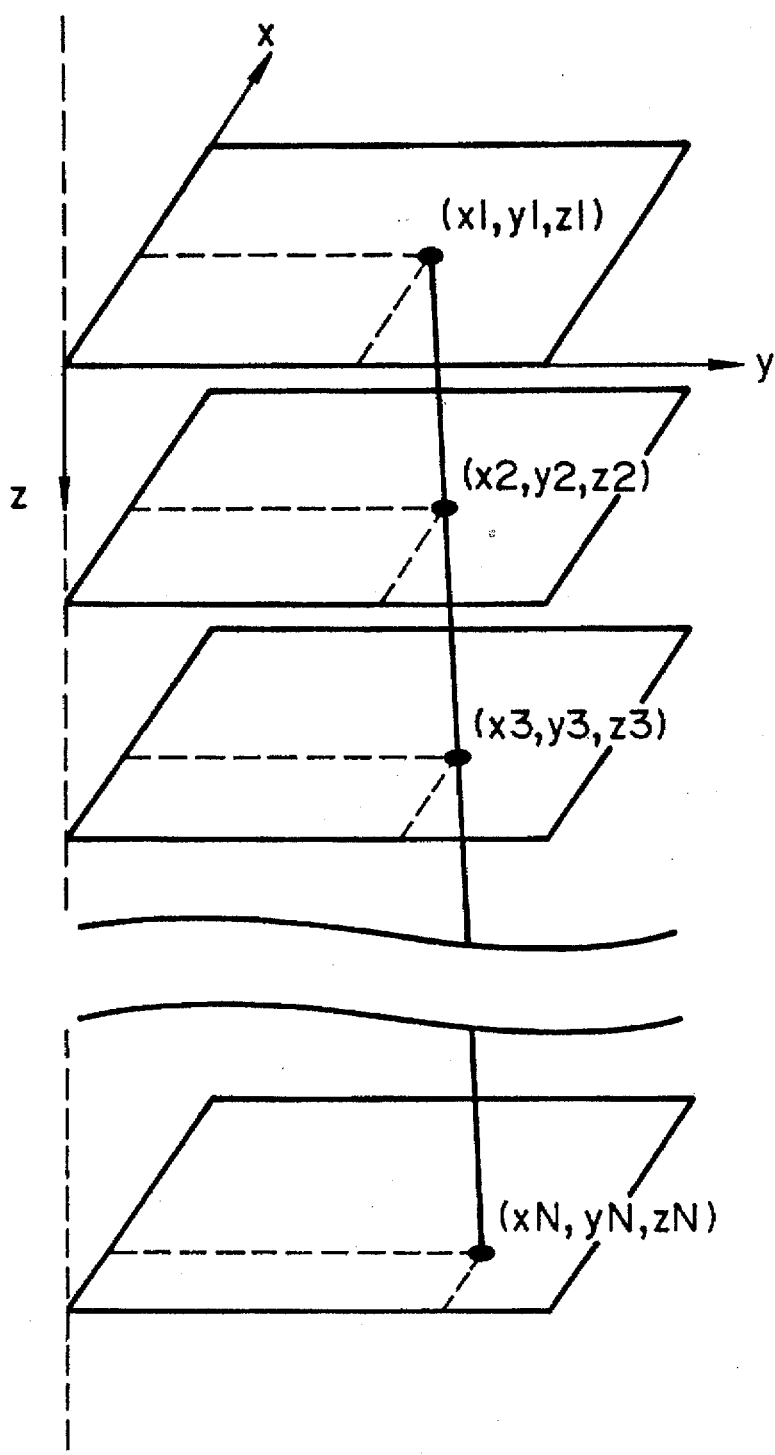
FIG. 14 is a diagram for explaining the three-dimensional space in which a bright spot is observed.

Further, in order to improve the accuracy of the deflection angle detection, the position of the detector is changed further, and the displacement δl(sn) (n=1, 2, 3, ..., N) is measured. Indicating the deflection point thus obtained in a three-dimensional space, the result is obtained as shown in FIG. 14, for example. In FIG. 14, black spots indicate the points where the electron beam is detected. Each detection point can be represented by coordinates (zn, yn, zn) (n=1, 2, 3, ..., N). For determining the straight line passing these points in space with high accuracy, the method of least square is used. Since the direction of the electron beam before deflection is along the z axis in FIG. 14, the inclination of the straight line with respect to the axis provides the deflection angle δθ.

According to this embodiment, explanation was made about the case in which the detector is moved in parallel to the direction of progress of the electron beam before deflection and where the particular direction is parallel to the z axis in a three-dimensional space. In the case where the axis of the electron beam is not parallel to the axis of movement or in the case where the accuracy of parallel movement of the detector is not sufficient, however, the position of the electron beam in the absence of a magnetic field is measured in advance by the detector at respective detector positions. Also, according to this embodiment, which was explained with reference to the method for moving a detector with respect to a magnetic field, a magnetic field may alternatively be moved for obtaining a similar result.

This technique can determine the linear integral value S of the magnetic field without installing a detector at a distant point. Further, by determining the linear integral value S from various directions of the magnetic field, the three-dimensional distribution of the magnetic field in space can be determined using the computer tomography technique.

Also, this technique can be used for measuring the magnetic field of a magnetic field lens and evaluating the properties of the lens from the three-dimensional distribution.

(Ninth embodiment)

According to the eighth embodiment, charged particle beams were focused into a single beam, which was applied through a magnetic field for the purpose of measurement. In the present embodiment, on the other hand, a plurality of charged particle beams are passed at a time through an electric field or a magnetic field, and the deflection angle of these charged particle beams is determined at a time. The following is an explanation for the case in which an electron beam and a magnetic field are used as in the eighth embodiment.

Figure 15:
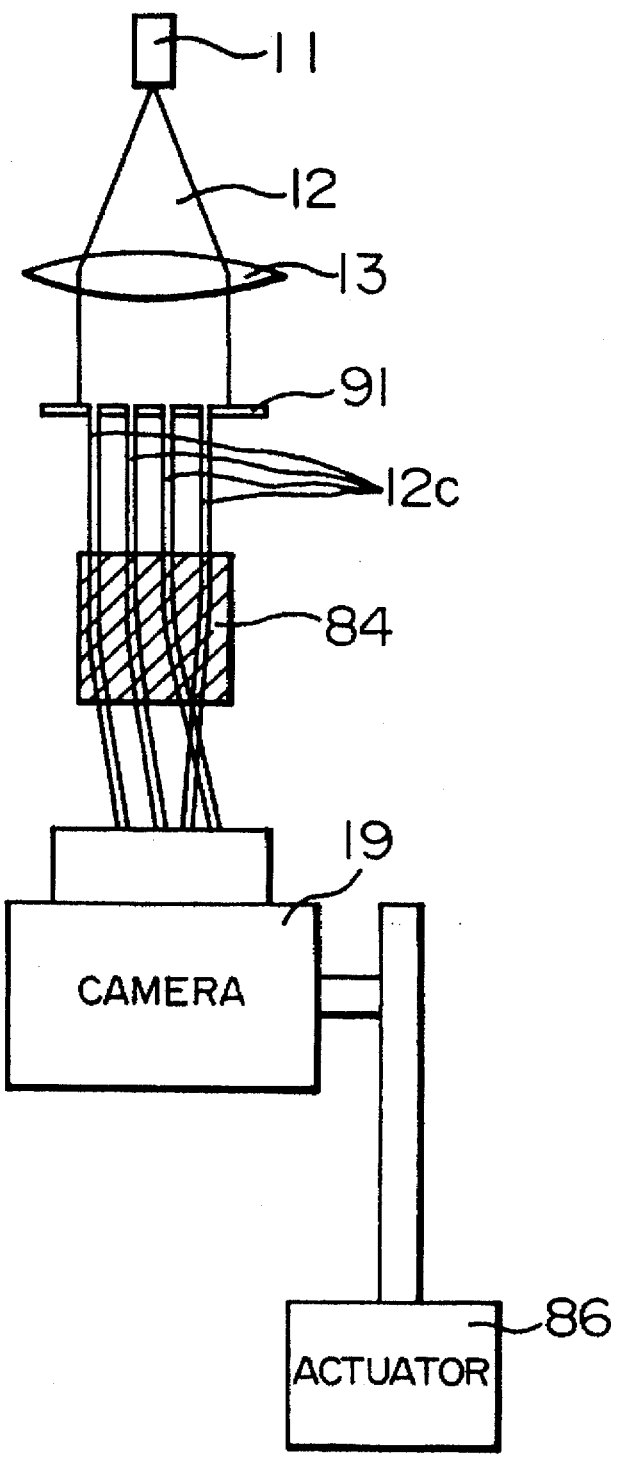
FIG. 15 is a diagram for explaining a ninth embodiment of the invention.
Figure 16A:
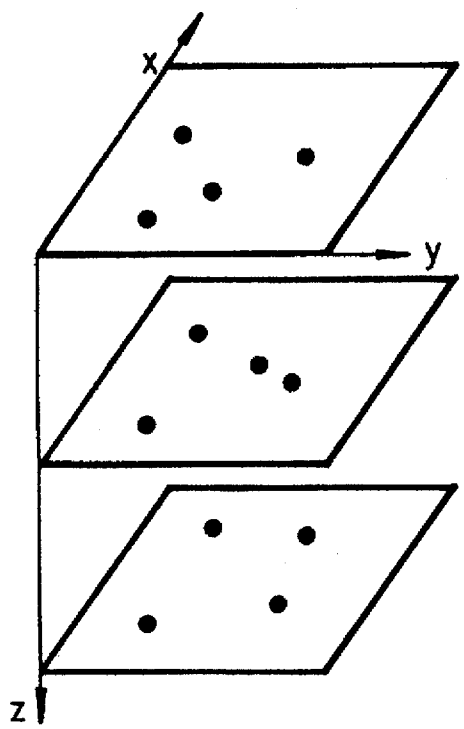
FIGS. 16A to 16C are diagrams showing a plurality of bright spots as an example observed in the three-dimensional space.

This embodiment will be described with reference to FIG. 15. In FIG. 15, an electron beam 12 generated from an electron beam source 11 is passed through a focusing lens 13 and also through a mask 91 for forming a plurality of electron beams used for measurement. The mask 91 has a number of apertures through which the electron beams are allowed to pass. The electron beams 12c that have been transmitted through the apertures are passed through a deflection region 84 formed by the magnetic field. A camera 19 is installed below the magnetic field to enable a plurality of bright spots of the electron beams to be observed at a time. As in the eighth embodiment, the camera 19 is moved by an actuator 86 to measure the points of bright spots of the electron beams. An example of the bright spots thus measured is shown in FIG. 16A.

Figure 16B:
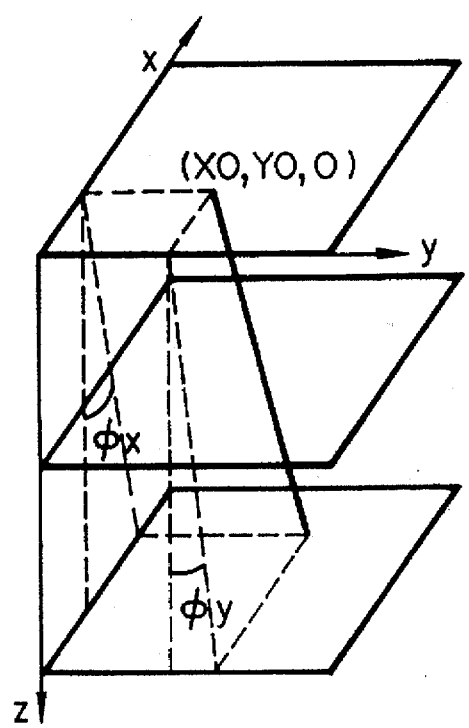

In order to detect a plurality of straight lines from the bright spots thus measured, Hough transform is effected as mentioned below. First, referring to FIG. 16B, assume that parameters representing a straight line in a three-dimensional space are given by the angles φx and φy that the straight line originating from the coordinate (X0, Y0) in the plane of z=0 and projected on the x-z plane and the y-z plane form with the z axis respectively. The equation for the straight line in the three-dimensional space is given as $$(x - X0)/(\cos\phi y \sin\phi x) = (y - Y0)/(\sin\phi y \cos\phi x) = z/(\cos\phi y \cos\phi x) \quad (18)$$

From Equation 18 are obtained, $$X0 = x - z \tan\phi x \quad (19)$$

$$Y0 = y - z \tan\phi y \quad (20)$$

Considering a given bright spot (x, y, z), the relation between the relation between four parameters of a straight line passing this spot can be determined from Equations 19 and 20. Changing the values φx, φy, the values of X0, Y0 also undergo a change. The values X0, Y0 change with φx, φy. Plotting the four parameter in space using this relation, a parameter combination with many plotted parameters indicates the four parameters of existing straight lines. According to this method, when positions plotted in considerable density are sequentially selected even in the case where the number of straight lines in space is unknown, straight lines as many as so selected are determined. In other words, a plurality of points can be measured at a time.

Figure 16C:
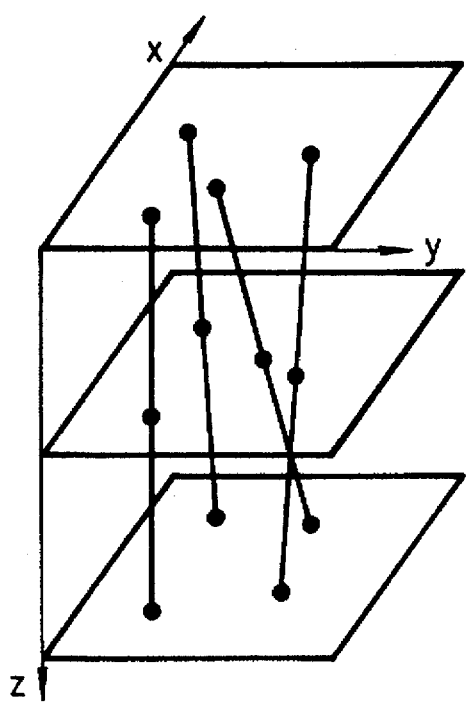

The straight lines thus obtained pass through bright spots in space as shown in FIG. 16C and have an inclination with respect to the z axis. The deflection angle of the respective electron beams can be determined from this inclination. Further, the linear integral value S of the magnetic field is determined from this deflection angle, and the magnetic field is rotated to effect similar measurements. By applying the computer tomography technique to the result of measurement, a spatial distribution of the magnetic field can be determined.

In place of the mask 91 used in the above-mentioned embodiment, a film through which the charged particle beam can be transmitted may be utilized to measure the electric field or the magnetic field. An example is shown in FIG. 17.

An electron beam 12 generated from an electron beam source 11 is passed through a focusing lens 13 and also through a film 101 having a pattern which develops a brightness pattern. The electron beam that is transmitted this way further forms an image plane 24 by way of an object lens 15. The image plane 24 forms an image of the film on a camera 19 through an imaging lens 104.

Figure 17:
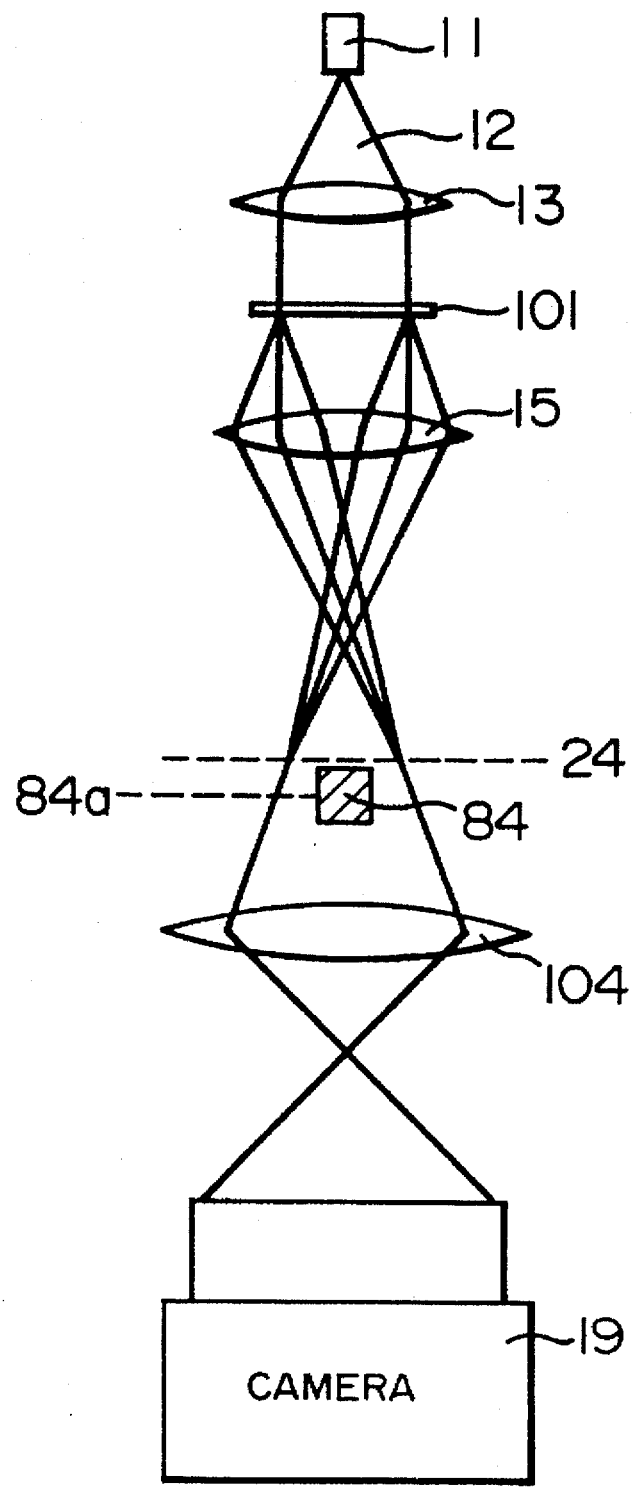
FIG. 17 is a diagram for explaining the case in which a film is used according to the ninth embodiment of the invention.

A deflection region 84 of the electric field or the magnetic field is installed in the course of the electron beam as shown in FIG. 17, and an image is observed. The image transmitted through the film 101 thus obtained is distorted. This is due to the fact that the electron beam is deflected by the electric field or the magnetic field thus installed. The deflection region 84 is moved along the direction of progress of the electron beam and an image is produced again. The image thus obtained has the same effect as in the above-mentioned embodiment. Considering a bright or a dark position of the transmitted image thus obtained, these positions are assumed to be points in space as in the aforementioned embodiments. The deflection angle can be measured by detecting straight lines using Hough transform in similar fashion.

The image of the image plane 24 is projected on the camera 19 by the imaging lens 104. The fact that the distance changes between the image plane 24 and the deflection region 84 is equivalent to the fact that the distance is changed between the detector 85 or the camera 19 and the deflection region 84 in the above-mentioned embodiments is changed. The position of the image plane 24 may be considered to be where a virtual detector is installed. Therefore, the image plane 24 may be moved instead of the deflection region 84 by changing the object lens 15 and the imaging lens 104. Since this is equivalent to the moving of the detector, the deflection angle can be measured in a manner similar to the aforementioned case. Also, the deflection angle can be measured with equal effect by moving the film 101 and the image plane 24 with the imaging lens 104 changed.

As described above, according to the present embodiment, measurement can be done for a plurality of electron beams at a time. As a consequence, the distribution of the deflection angle of the electron beams developed in a region having a certain size can be measured at a time. Further, the three-dimensional magnetic field distribution can be measured very efficiently with a short time using this deflection angle distribution.

It will thus be understood from the foregoing description that according to the present invention, there is provided a method of measuring the magnetic field and a charged particle beam apparatus using the method, wherein the image processing represented by pattern matching is performed using a first image not affected by a magnetic field and a second image distorted under the influence of a magnetic field. As an alternative, the image processing is conducted for detecting an orbit from a plurality of images obtained by changing the position of the magnetic field and an image-forming position. In this way, the spatial resolution and the dynamic range of the magnetic field can be distinguished from each other, thereby making it possible to measure the magnitude and direction of the magnetic field at each spatial point with high resolution and high sensitivity.

The present invention has been described in detail, it should be understood that various changes, substitutions and alterations can be made hereto without departing from the spirit and cope of the present invention as defined by the appended claims.

We claim:

1. A method of measuring a magnetic field comprising the steps of:

transmitting a charged particle beam through a reference specimen, forming an image from the charged particle beam with a desired magnification and detecting a first image;

storing digitally the first image detected;

passing the charged particle beam through a region containing a magnetic field to be measured, forming an image with a desired magnification from the charged particle beam deflected by the magnetic field to be measured, and detecting a second image, said second image being independent of the first image;

storing digitally, separate from the first image, the second image detected;

processing digitally the first image and the second image stored and determining the displacement of the charged particle beam; and determining the magnetic field distribution to be measured in space by calculations based on the displacement.

2. The method of measuring a magnetic field according to claim 1, wherein said image processing is a digital matching operation.

3. A method of measuring a magnetic field, comprising the steps of:

transmitting a charged particle beam through a reference specimen, forming an image from the charged particle beam with a desired magnification and detecting a first image;

storing the first image detected;

passing the charged particle beam through a region containing a magnetic field to be measured, forming an image with a desired magnification from the charged particle beam deflected by the magnetic field to be measured, and detecting a second image;

storing the second image detected;

processing the first image and the second image stored and determining the displacement of the charged particle beam; and determining the magnetic field distribution to be measured in space by calculations based on the displacement, wherein said image processing is a digital matching operation; and, wherein said digital matching operation includes the steps of extracting a third image having a predetermined size from the first image, overlapping the third image and the second image and adding the differences of bright values of corresponding pixels in each of overlap regions, determining an overlap point of the third image and the second image associated with the minimum value of the sum, and determining the displacement of the charged particle beam from the overlap point thus determined.

4. A method of measuring a magnetic field comprising the steps of:

transmitting a charged particle beam through a reference specimen, forming an image from the charged particle beam with a desired magnification and detecting a first image;

storing the first image detected;

passing the charged particle beam through a region containing a magnetic field to be measured, forming an image with a desired magnification from the charged particle beam deflected by the magnetic field to be measured, and detecting a second image;

storing the second image detected;

processing the first image and the second image stored and determining the displacement of the charged particle beam; and determining the magnetic field distribution to be measured in space by calculations based on the displacement, wherein said image processing is a digital matching operation; and, wherein said digital matching operation includes the steps of quantizing the first image and the second image by a finite number of pixels respectively and sampling the data of bright values of each pixel with at least one bit.

5. A method of measuring a magnetic field, comprising the steps of:

transmitting a charged particle beam through a reference specimen, forming an image from the charged particle beam with a desired magnification and detecting a first image;

storing the first image detected;

passing the charged particle beam through a region containing a magnetic field to be measured, forming an image with a desired magnification from the charged particle beam deflected by the magnetic field to be measured, and detecting a second image;

storing the second image detected;

processing the first image and the second image stored and determining the displacement of the charged particle beam; and determining the magnetic field distribution to be measured in space by calculations based on the displacement, wherein said image processing is a digital matching operation; and, wherein said digital matching operation includes the steps of extracting a third image having a predetermined size from the second image and overlapping the third image thus extracted and the first image, said method further comprising selected one of the steps of overlapping the extracted third image and the first image thereby to calculate the cross-correlation efficient and adding the differences of bright values of corresponding pixels in an overlap region.

6. The method of measuring a magnetic field according to claim 1, wherein the reference specimen has an uneven irregular surface of a cross section and has a structure which is not periodic.

7. A charged particle beam apparatus comprising:

means for generating a charged particle beam;

means for focusing the charged particle beam;

a reference specimen through which the charged particle beam is transmitted for forming an image, said reference specimen being located between said means for generating a charged particle beam and a specimen for generating a magnetic field to be measured;

a holder for mounting said reference specimen;

a stage for arranging at a desired position the specimen for generating a magnetic field to be measured;

means for adjusting the image of said reference specimen formed by the transmission of the charged particle beam with a desired magnification;

means for detecting an image of the reference specimen adjusted to the desired magnification;

means for storing an image of said reference specimen detected;

means for processing the image of said reference specimen stored; and, means for determining a magnetic field to be measured in space from the result of image processing.

8. The charged particle beam apparatus according to claim 7, further comprising means for driving a specimen for generating a magnetic field to be measured.

9. The charged particle beam apparatus according to claim 8, wherein said detection means detects an image of said reference specimen when said drive means is inactive and an image of said reference specimen when said drive means is active.

10. The charged particle beam apparatus according claim 7, wherein said detection means includes a structure for detecting images of the reference specimen by changing the distance between the specimen for generating a magnetic field to be measured and the image-forming position of said charged particle beam.

11. The charged particle beam apparatus according to claim 7, wherein said image processing means includes means for matching operation.

12. The charged particle beam apparatus according to claim 7, wherein said image processing means includes means for determining the orbit of said charged particle beam.

13. A charged particle beam apparatus comprising:

means for generating a charged particle beam;

a reference specimen;

a lens system;

a holder for holding a specimen; and, detecting means including a two-dimensional image pickup device and an image processing section for detecting information of an image included in said charged particle beam which arrives at said means for detecting through said lens system;

wherein the charged particle beam passes through the reference specimen before irradiating the specimen held by said holder;

wherein a magnetic field providing an object of measurement is arranged in a route of the charged particle beam;

wherein said charged particle beam has a finite diameter when passing through said magnetic field and includes a brightness pattern of a brightness contrast corresponding to a projected image of said reference specimen;

wherein an imaging position of said brightness pattern is changed with respect to a position of said magnetic field by adjusting said lens system, so that a plurality of brightness patterns are obtained;

wherein said brightness patterns are detected by said two-dimensional pickup device;

wherein deflection angles of said charged particle beam are determined by calculations in said image processing section by using information of said brightness patterns; and, wherein a magnetic field in space is determined by calculations based on said deflection angles.

14. The charged particle beam apparatus according to claim 13, wherein the deflection angle of the charged particle beam is determined by calculations using Hough transform in the image processing section.

15. The charged particle beam apparatus according to claim 13, wherein the deflection angle of the charged particle beam is determined by calculations using a least square method in the image processing section.

16. The charged particle beam apparatus according to claim 13, wherein said object of measurement is an electric field.

17. The charged particle beam apparatus according to claim 13, wherein the properties of a selected one of a magnetic field lens and an electrostatic lens are evaluated by measuring a three-dimensional intensity distribution of a selected one of a magnetic field of said magnetic field lens and an electric field of said electrostatic lens, respectively.

18. The method of measuring a magnetic field according to claim 1, wherein said reference specimen is composed of at least two types of materials.

19. The method of measuring a magnetic field according to claim 1, wherein said reference specimen is a film.

20. The method of measuring a magnetic field according to claim 1, wherein said reference specimen has an irregular arrangement of particles.

21. The method of measuring a magnetic field according to claim 1, wherein said reference specimen has at least two particle sizes.

22. The method of measuring a magnetic field according to claim 1, wherein the reference specimen permits observation of a plurality of bright values in selected one of a bright field image and a dark field image of the transmitted charged particle beam.

23. The method of measuring a magnetic field according to claim 1, wherein said reference specimen can form an image having at least two sizes of positions with the same bright value observed in a region corresponding to the spatial resolution when the particles making up the reference specimen are observed in a selected one of the bright field image and a dark field image of the transmitted charged particle beam.

24. The method of measuring a magnetic field according to claim 1, wherein the reference specimen has at least two different particle sizes observed in a region corresponding to the spatial resolution in a selected one of a bright field image and a dark field image of the transmitted charged particle beam.

25. The method of measuring a magnetic field according to claim 1 wherein the calculations of the determining step are computer tomography calculations.

26. The charged particle beam apparatus according to claim 7, wherein a specimen for generating an electric field is comprised instead of said specimen for generating a magnetic field.

27. The charged particle beam apparatus according to claim 7, wherein the properties of selected one of a magnetic field lens and an electrostatics lens are evaluated by measuring a three-dimensional intensity distribution of a selected one of a magnetic field of said magnetic field lens and an electric field of said electrostatic lens, respectively.

28. The charged particle beam apparatus according to claim 7, wherein said image processing means includes Fourier transform means.

29. The charged particle beam apparatus according to claim 7, wherein said means for determining a magnetic field to be measured in space includes means for computer tomography image processing.

30. The charged particle beam apparatus according to claim 7, wherein said reference specimen is made of at least two types of materials.

31. The charged particle beam apparatus according to claim 7, wherein said reference specimen is made of a film.

32. The charged particle beam apparatus according to claim 7, wherein said reference specimen has an irregular arrangement of particles making up said reference specimen.

33. The charged particle beam apparatus according to claim 7, wherein said reference specimen has at least two different sizes of particles.

34. The charged particle beam apparatus according to claim 7, wherein said reference specimen is such that a plurality of bright values can be observed in selected one of a bright field image and a dark field image of the charged particle beam transmitted.

35. The charged particle beam apparatus according to claim 7, wherein said reference specimen forms an image having at least two different sizes of areas having the same bright value as observed in a region corresponding to the spatial resolution when the particles making up the reference specimen are observed as a selected one of a bright field image and a dark field image of the charged particle beam transmitted.

36. The charged particle beam apparatus according to claim 7, wherein said reference specimen has at least two different sizes of particles observed in a region corresponding to the spatial resolution when the particles making up said reference specimen are observed as a selected one of a bright field image and a dark field image of the charged particle beam transmitted.

37. The charged particle beam apparatus according to claim 7, wherein said reference specimen has a given cross section irregular in shape with an uneven surface and not periodic in structure.

38. The charged particle beam apparatus according to claim 7, wherein said charged particle beam has an extended diameter for including at least a part of said specimen for generating said magnetic field.

* * * * *